United States Patent [19]

Burrowes et al.

[11] Patent Number: 4,646,084

[45] Date of Patent: Feb. 24, 1987

[54] METER READING METHODS AND APPARATUS

[75] Inventors: David E. Burrowes; Alan W. Holmes, both of Dayton, Ohio

[73] Assignee: Energy Innovations, Inc., Dayton, Ohio

[21] Appl. No.: 747,243

[22] Filed: Jun. 21, 1985

[51] Int. Cl.[4] .............................................. G08C 19/36
[52] U.S. Cl. ........................... 340/870.03; 250/231 SE; 340/310 A; 340/870.29
[58] Field of Search ...................... 340/870.29, 870.03, 340/870.02, 347 P, 310 A; 250/231 SE

[56] References Cited

U.S. PATENT DOCUMENTS

| | | |
|---|---|---|
| 1,750,242 | 3/1930 | Ostrolenk . |
| 1,802,643 | 4/1931 | Floyd . |
| 1,902,465 | 3/1933 | Pratt . |
| 1,933,996 | 11/1933 | Paris ................................... 234/35 |
| 2,176,720 | 10/1939 | Rayner et al. ....................... 117/351 |
| 2,240,937 | 5/1941 | McNaney ............................. 117/380 |
| 3,127,594 | 3/1964 | Roe et al. ............................. 340/203 |
| 3,231,670 | 1/1966 | Lane et al. ................................ 179/2 |
| 3,352,971 | 11/1967 | Nilsson et al. ........................... 179/2 |
| 3,399,347 | 8/1968 | Martens ................................ 324/96 |
| 3,445,814 | 5/1969 | Spalti ................................... 340/151 |
| 3,478,342 | 11/1969 | Alldritt et al. ....................... 340/194 |
| 3,491,244 | 1/1970 | Stewart ............................... 250/219 |
| 3,503,061 | 3/1970 | Bray et al. ........................... 340/180 |
| 3,508,003 | 4/1970 | Moyers .................................... 179/2 |
| 3,508,243 | 4/1970 | Nyfeler et al. ....................... 340/310 |
| 3,588,357 | 6/1971 | Sellari .................................... 179/2 |
| 3,609,691 | 9/1971 | Stewart ............................... 340/151 |
| 3,656,112 | 4/1972 | Paull .................................... 340/151 |
| 3,688,271 | 8/1972 | Rouse ............................... 340/172.5 |
| 3,705,385 | 12/1972 | Batz .................................. 340/152 R |
| 3,733,493 | 5/1973 | McClelland ......................... 250/233 |
| 3,742,142 | 6/1973 | Martin ................................. 179/2 A |
| 3,747,068 | 7/1973 | Bruner et al. ....................... 340/151 |
| 3,750,156 | 7/1973 | Martell ................................ 340/203 |
| 3,778,795 | 12/1973 | Campman et al. ............... 340/188 R |
| 3,786,423 | 1/1974 | Martell ................................ 340/151 |
| 3,815,119 | 6/1974 | Finlay et al. ......................... 340/310 |
| 3,820,073 | 6/1974 | Vercellotti et al. .................. 340/151 |
| 3,829,835 | 8/1974 | Stewart ............................... 340/151 |
| 3,842,206 | 10/1974 | Barsellotti et al. ....................... 179/2 |
| 3,842,208 | 10/1974 | Paraskevakos ..................... 179/5 R |
| 3,868,640 | 2/1975 | Binnie et al. ........................ 340/151 |
| 3,878,391 | 4/1975 | McClelland et al. ............... 250/233 |
| 3,899,639 | 8/1975 | Clevely et al. ...................... 179/2 A |
| 3,899,774 | 8/1975 | Binnie et al. ........................ 340/163 |
| 3,922,490 | 11/1975 | Pettis ................................... 179/2 A |
| 3,922,492 | 11/1975 | Lumsden ............................ 179/2 A |
| 3,937,890 | 2/1976 | Blethen et al. ...................... 179/2 A |
| 3,943,498 | 3/1976 | McClelland et al. ............... 340/206 |
| 3,962,545 | 6/1976 | Abe .................................. 179/2 AM |
| 3,975,589 | 8/1976 | Ebner et al. ..................... 179/2 AM |
| 3,980,954 | 9/1976 | Whyte ................................... 325/48 |
| 3,989,898 | 11/1976 | Dugan et al. ................... 179/2 AM |
| 4,004,097 | 1/1977 | Spaulding ........................... 179/2 A |
| 4,008,458 | 2/1977 | Wensley .............................. 340/151 |
| 4,022,977 | 5/1977 | Nomura ........................... 179/2 AM |
| 4,034,292 | 7/1977 | McClelland ......................... 324/157 |
| 4,035,772 | 7/1977 | Abe et al. ............................ 340/151 |
| 4,059,727 | 11/1977 | Kingswell et al. .............. 179/2 AM |
| 4,070,549 | 1/1978 | Baker ................................... 179/2 A |

Primary Examiner—Jerry W. Myracle
Attorney, Agent, or Firm—Robert R. Jackson

[57] ABSTRACT

Meters having a plurality of rotating dials are read automatically by using radiant energy to sense the angular positions of the dials. A single radiant energy detector is time-shared among the several dials to reduce the cost of the meter reading apparatus. The meter can transmit meter readings and other information to remote locations. It can also receive, store, and act upon information received from remote locations. The meter can measure short-term demand, and can produce output signals for indicating and/or controlling demand.

18 Claims, 26 Drawing Figures

METER READING METHODS AND APPARATUS

BACKGROUND OF THE INVENTION

This invention relates to methods and apparatus for reading meters, particularly those having a plurality of rotating dials. The invention also relates to meter reading apparatus for performing related communications and control functions.

It has long been recognized that automatic reading of meters, such as electric and gas utility meters, would be highly desirable. One of the major obstacles to implementing such systems has been the relatively high cost of the meter reading apparatus which must be associated with each meter. In a typical electric or gas utility system having tens of thousands or even hundreds of thousands of meters, minimizing individual meter cost is essential to an economically viable automatic meter reading system. The difficulty of converting to automatic meter reading capability large numbers of existing meters, of which there may be several different types in use in a single utility system, is another extremely important consideration. Although several automatic meter reading systems have been proposed, none has been widely adopted, at least partly because of the relatively high cost or other disadvantages of the additional apparatus required in association with each meter. Among the other disadvantages of many of the previously proposed systems is the requirement for battery back-up to retain stored data during power outages.

To take full advantage of automatic meter reading, it is desirable for the meter to be able to transmit its readings to remote locations. Systems with that capability have been proposed, as shown, for example, by Sellari U.S. Pat. No. 3,588,357. However, it would also be desirable to be able to control various functions of the meter from remote locations for such purposes as meter reading on command, controling individual utility customer demand, and/or controlling overall system demand.

In view of the foregoing, it is an object of this invention to provide improved and simplified automatic meter reading methods and apparatus.

Another object of this invention is to provide low cost but highly reliable automatic meter reading methods and apparatus.

Still another object of this invention is to provide automatic meter reading methods and apparatus which can easily and economically applied to many different types of existing meters.

Yet another object of this invention is to provide solid state electronic meter reading and control apparatus which can recover from a power outage without the aid of battery back-up.

Still another object of this invention is to provide automatic meter reading methods and apparatus including the capability of transmitting information to remote locations and receiving information from remote locations.

Yet another object of this invention is to provide automatic meter reading methods and apparatus including the capability of generating signals for at least partially controlling the use of the metered service based on service demand as measured by the meter, control parameters stored in the meter as a result of either local or remote control of the meter, and the like.

SUMMARY OF THE INVENTION

These and other objects of the invention are accomplished in accordance with the principles of the invention by mounting a patterned disc for rotation with each of the dials of a meter having a plurality of such dials. Each disc has sectors of different radiant energy attenuating properties. Radiant energy is directed to the discs one at a time in succession so that the radiant energy directed to each disc is encoded by the sectored pattern of that disc. The encoded radiant energy is directed from each disc to a single sensor location. A sectored detector is disposed at the sensor location so that each detector sector receives a portion of the encoded radiant energy and produces an output signal indicative of the intensity of the received encoded radiant energy. The output signals of the sectored detectors are processed to determine the angular position of the disc to which radiant energy is currently being directed. The angular positions of all of the dials are determined in this manner to provide a complete reading of the meter.

The meter may produce output signals for transmitting its readings and other information to a remote location. The meter may also be capable of receiving, storing, and acting upon control signals and other information received from a remote location. The meter may also visually display its readings and other information.

The meter may also include methods and apparatus for automatically measuring the short-term demand for the service or commodity being metered. For example, in an electric meter having a rotating eddy current disc, the number of rotations of the disc in a predetermined time interval (e.g., 1 minute, 15 minutes, 30 minutes, etc.) can be determined by counting the number of times during that time interval that a non-reflective spot or mark on the disc passes a predetermined reference point. The meter may transmit its demand readings to a remote location in a manner similar to transmission of usage readings. Alternatively or in addition, the meter may process the demand readings, typically in conjunction with demand limits or other information stored in the meter either locally or remotely or both, to produce output signals for controlling apparatus which is or may be responsible for the demand.

Further features of the invention, its nature and various advantages will be more apparent from the accompanying drawings and the following detailed description of the invention.

DETAILED DESCRIPTION OF THE INVENTION

Although certain aspects of this invention are applicable to reading many different types of meters having a plurality of rotating dials, those aspects of the invention will by fully understood from an explanation of their application to a typical electric utility watthour meter.

Figure 1:
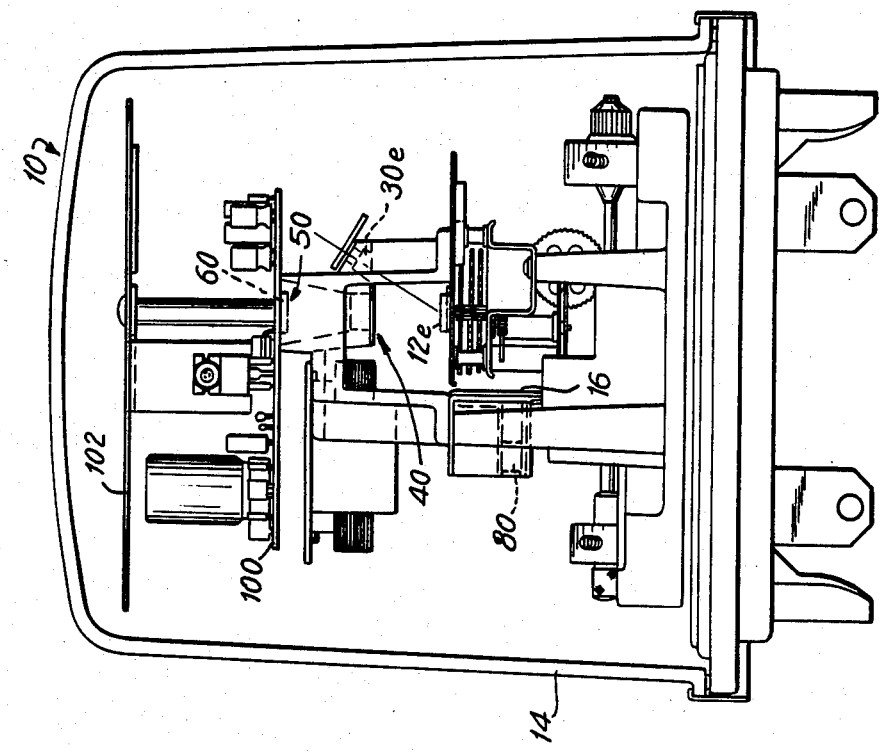
FIG. 1 is a partly sectional plan view of an illustrative electric utility meter modified in accordance with the principles of this invention.
Figure 2:
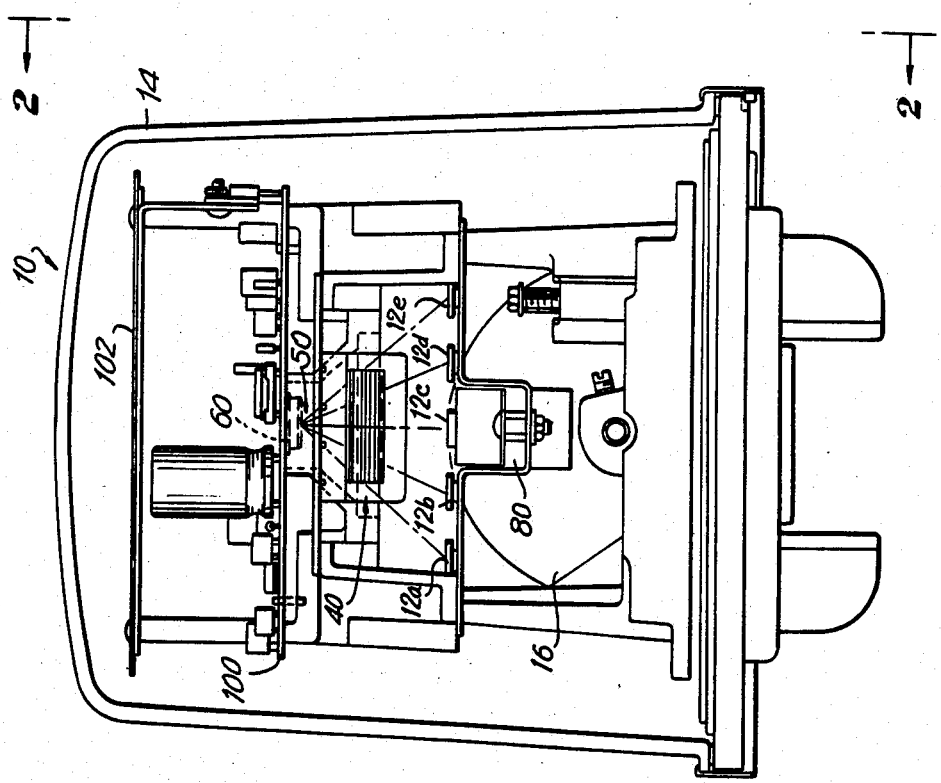
FIG. 2 is an elevational view of the meter of FIG. 1 taken along the line 2—2 in FIG. 1.

As shown in FIGS. 1 and 2, a typical watthour meter 10 includes a plurality of rotating dials 12a-e for indicating, in any convenient number system such as base 10, the amount of electrical energy consumed in the circuit monitored by the meter. In the depicted embodiment there are five dials 12, the angular position of each of which represents one digit of a five-digit decimal number. Although the depicted meter hase five dials 12, it will be understood that the meter could have any number of such dials.

Figure 5:
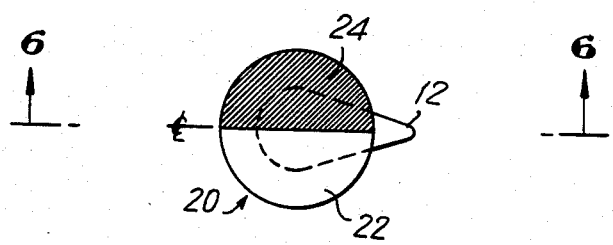
FIG. 5 is a detailed elevational view of a portion of the apparatus of FIGS. 1 and 2.
Figure 6:
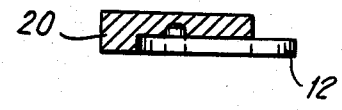
FIG. 6 is a cross sectional view taken along the line 6—6 in FIG. 5.
Figure 7:
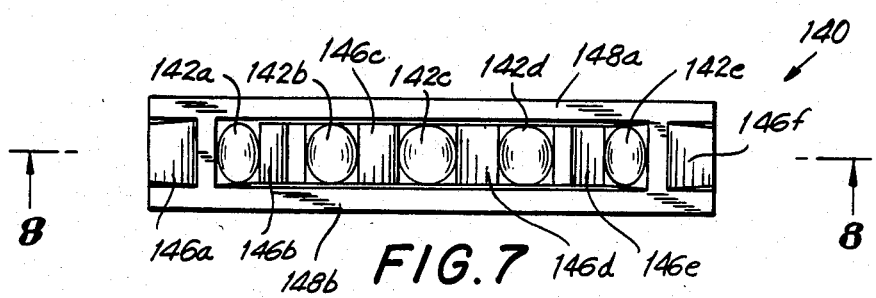
FIG. 7 is an elevational view of an illustrative optical assembly for use in the meter of FIGS. 1 and 2.

Affixed to each dial 12 is a patterned disc 20 of the type shown and described in commonly assigned Burrowes et al. U.S. patent application Ser. No. 624,156, filed June 25, 1984 now U.S. Pat. No. 4,587,513 (hereinafter "Burrowes et al."), which is hereby incorporated by reference herein. Although one particular disc configuration is employed in the depicted embodiment, it will be understood that any of the disc configurations taught by Burrowes et al. could be used. In the depicted embodiment each disc 20 is a circular and is mounted on the associated dial 12 for concentric rotation therewith as shown in detail in FIGS. 5 and 6. Each disc is preferably shaped to conform to the associated dial so that the disc can be simply pressed on over the dial. If desired, any suitable means, such as an adhesive, can be used for securing discs 20 to dial 12. The exposed face of each disc 20 has two bilaterally symmetrical sectors 22 and 24. Sectors 22 and 24 have substantially different radiant energy attenuating characteristics. For example, sector 22 may reflect substantially more radiant energy than sector 24 if, as in the depicted embodiment, reflected radiant energy is employed to read meter 10.

Figure 11:
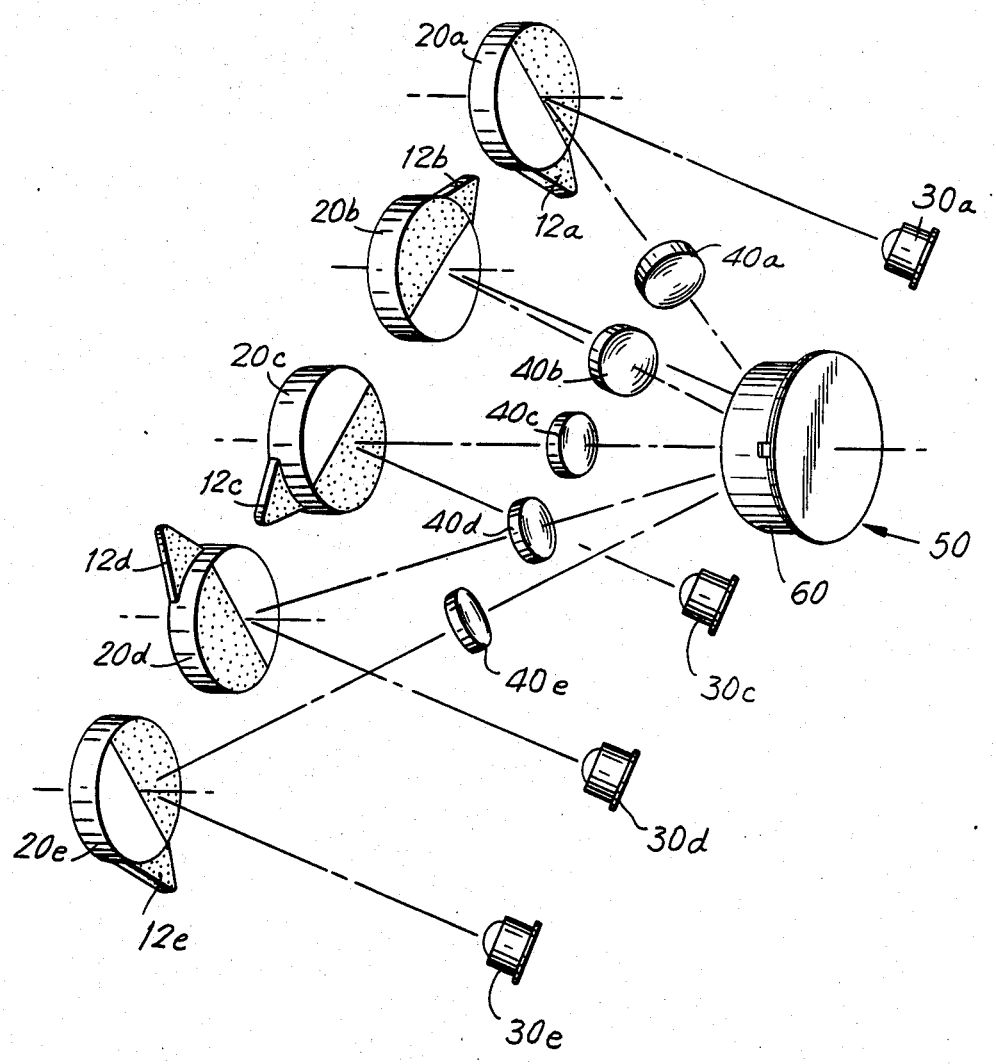
FIG. 11 is a simplified perspective view of an illustrative optical system for use in the meter of FIGS. 1 and 2.

A plurality of radiant energy sources 30a-e (only one of which is visible in FIG. 2) is mounted in front of discs 20a-e so that radiant energy from each source 30 is directed to a respective one of discs 20 (see also FIG. 11). In the particular embodiment shown in the drawings, sources 30 are infrared light emitting diodes ("LEDs"). Sources 30 are energized one after another in a predetermined sequence by electrical control circuitry described in detail below. Because of the differing radiant energy attenuating properties of the two sectors 22 and 24 of each disc 20, the radiant energy reflected by each disc encodes the angular position of the disc as taught by Burrowes et al.

Radiant energy reflected by each disc 20 is directed to a single sensor location 50 by a plurality of lenses 40a-e, each of which is disposed along an axis between a respective one of disc 20a-e and sensor location 50 (See FIG. 11). Each lens 40 is shaped to focus the radiant energy reflected by the associated disc at sensor location 50. A particularly preferred lens assembly is shown in detail in FIGS. 7-10 and described below.

Sectored detector 60 is disposed at sensor location 50 to receive the reflected radiant energy from each of lenses 40. Detector 60 may be similar to the detectors shown by Burrowes et al. Accordingly, detector 60 is divided into four equal, angularly distributed quadrants, each of which receives a sector of the encoded radiant energy from the disc 20 which is currently exposed to radiant energy from one of sources 30. Each sector of detector 60 produces an electrical output signal proportional to the amount of radiant energy received by that detector sector. The four output signal of detector 60 are analyzed in the manner taught by Burrowes et al. to produce data words indicative of the angular position of the disc 20 currently supplying encoded radiant energy to detector 60. This corresponds to the angular position of the meter dial 12 associated with that disc. This partial meter reading information is combined with similar information for each dial 12 to produce a complete reading of the meter.

It should be noted that everything which must be added to the conventional meter apparatus in accordance with this aspect of the invention can typically be added in front of dials 12. This is true of discs 20, sources 30, lenses 40, and detector 60. It is also true of (1) circuit board 100 which carries substantially all of the electronic circuitry needed to control the foregoing meter reading operation and other related functions described in detail below, and (2) heat sink and cover plate assembly 102 which is mounted over circuit board 100. The arrangement of the apparatus of this invention greatly facilitates mounting of the apparatus on a wide variety of conventional meters. The associated meter apparatus can be basically unchanged. Accordingly, the apparatus of this invention can be easily and inexpensively added to many different types of known meters.

For monitoring short-term power demand, a reflective sensor assembly 80 is mounted adjacent to one planar surface of the rotating eddy current disc 16 in meter 10 so that radiant energy produced by sensor assembly 80 is reflected back to that assembly from the surface of disc 16. The typical eddy current disc 16 is made of a highly reflective metal. One or more small, radial, partially reflective marks (not shown) are added to the surface of disc 16 which is exposed to radiant energy from sensor assembly 80. Accordingly, the amount of reflected radiant energy received by sensor assembly 80 is used to detect the passage of the partially reflective mark or marks on disk 16. Short-term demand is calculated by counting the number of times a partially reflective mark passes sensor assembly 80 in a predetermined period of time (e.g., 1, 15, 20, 30, 40, or 60 minutes) and scaling that number in accordance with the predetermined calibration factor of the meter.

Figure 3:
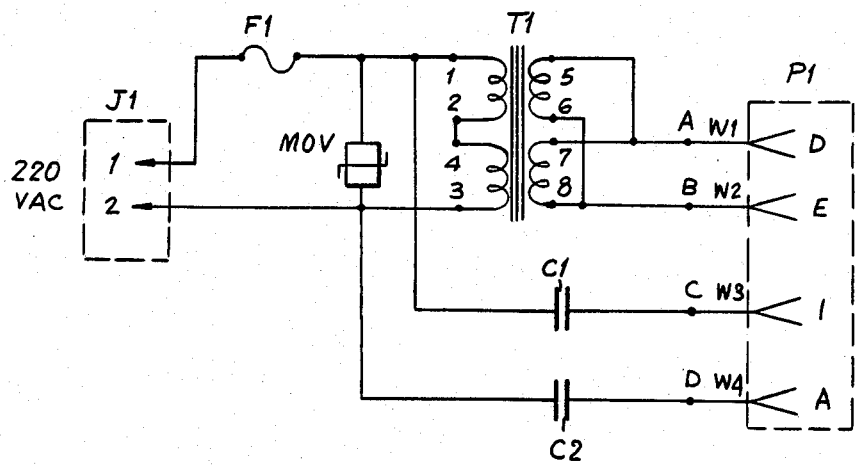
FIG. 3 is a schematic drawing of a portion of the electronic circuitry for the meter of FIGS. 1 and 2.

FIGS. 3 and 4 depict illustrative electronic circuitry, located for the most part on circuit board 100, for use as part of the automatic meter reading apparatus of this invention. FIG. 3 is an illustrative power supply circuit, and FIGS. 4a–c (which go together as shown in FIG. 4d) are the main logic and control circuit.

Figure 4D:
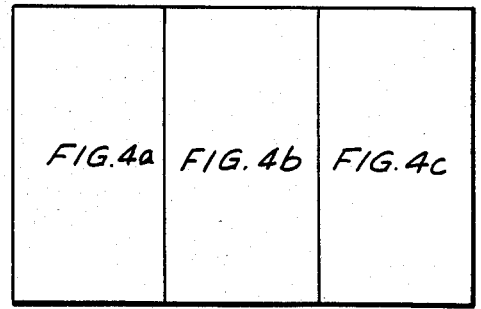
FIGS. 4a–c, which are to be assembled as shown in FIG. 4d, are collectively a schematic diagram of another portion of the electronic circuitry for the meter of FIGS. 1 and 2.
Figure 4A:
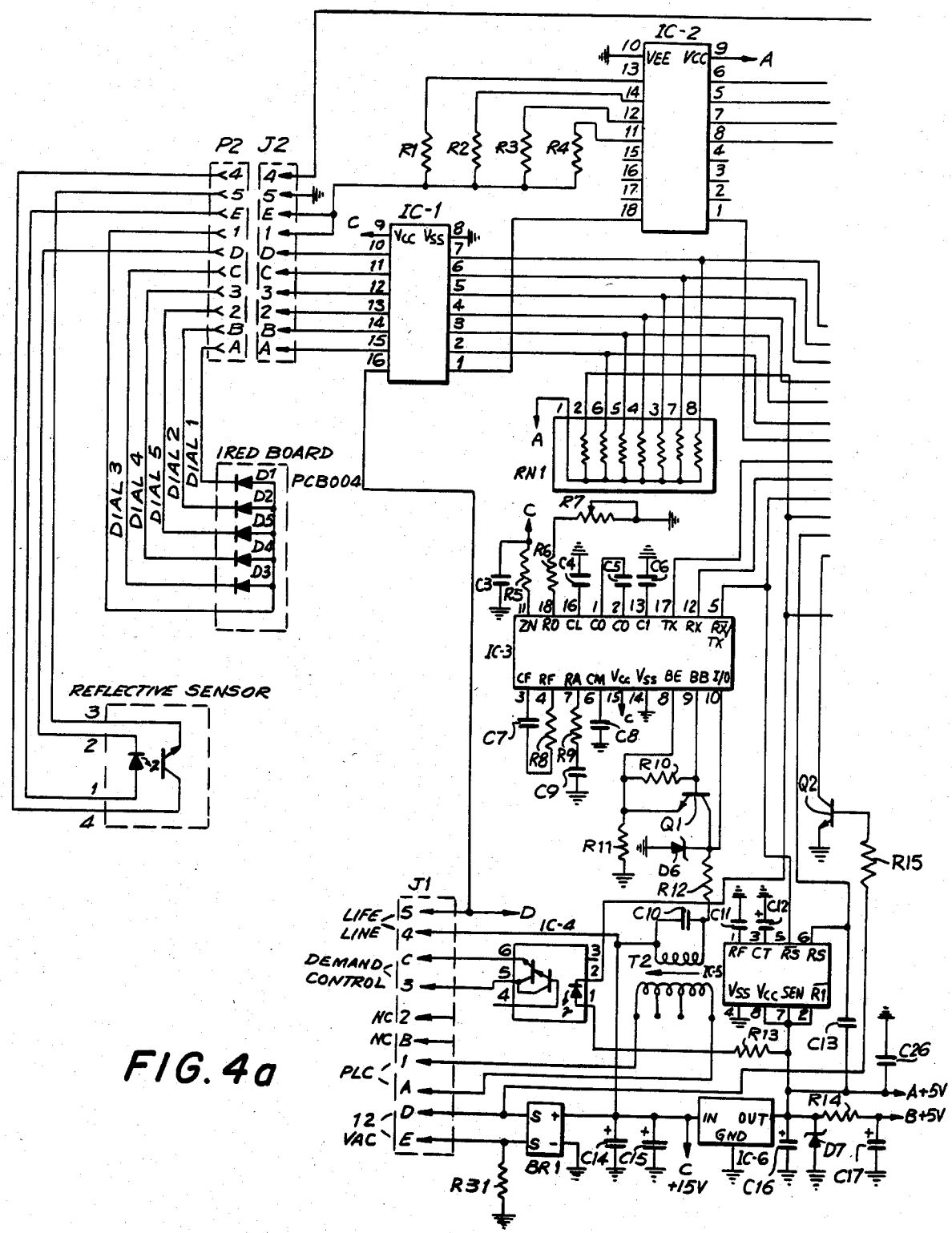

As shown in FIG. 3, connector jack J1 is connected to the power circuit being metered, typically a 220 volt, two phase, alternating current ("AC") power circuit. This connection is preferably made upstream of any power circuit control device controlled by the apparatus of this invention as discussed in detail below so that the circuitry of this invention is powered even if power has been cut off to the customer beyond the meter. The power supply circuit is protected by fuse F1. Transformer T1 applies 12 volt alternating current electrical power to terminals D and E of connector P1. Relatively high frequency (e.g., 125 KHz) data signals are superimposed on both phases of the power signal circuit by way of connector P1 terminals 1 and A and low frequency blocking capacitors C1 and C2. Communication via these high frequency data signals (also known as power line carrier or PLC signals is bidirectional. Accordingly, PLC signals can pass either (1) from the power signal circuit (either or both phases) connected to jack J1 to connector P1 terminals 1 and A, or (2) from terminals 1 and A to the power signal circuit (both phases). PLC signals received via one power signal phase are coupled to the other power signal via the lower coil of transformer T2 (FIG. 4a). In addition, the apparatus of this invention can be used to receive PLC signals from either power signal phase and then retransmit those signals via both phases as described in detail below. Conventional metal oxide varistor MOV provides overvoltage (surge) protection.

Connector P1 terminals D, E, 1, and A are respectively connected to terminals D, E, 1, and A of connector J1 in FIG. 4a. The 12 volt AC signal from terminals D and E is applied to conventional bridge rectifier BR1 and then to conventional voltage regulator IC-6. (All of the IC parts shown in FIG. 4 can be commercially available devices. A list of suitable devices will be found below following the discussion of FIG. 4.) The +5 volt output signal of IC-6 (applied to common point A) is used throughout the FIG. 4 circuitry as a logic and power signal. For example, the VCC input terminal of microcomputer IC-7 (described in detail below) is connected to +5 volt common point A. The +5 volt signal at common point B and the +15 volt signal at common point C are similar. In the event of a power failure, the energy stored in capacitor C14 allows the FIG. 4 circuitry to continue to function long enough (e.g., approximately 20 milliseconds) to store the time of the failure in an electrically erasable programmable read-only memory ("EEPROM") IC-8 and to complete any other IC-8 erase/write cycle then in progress.

Figure 4B:
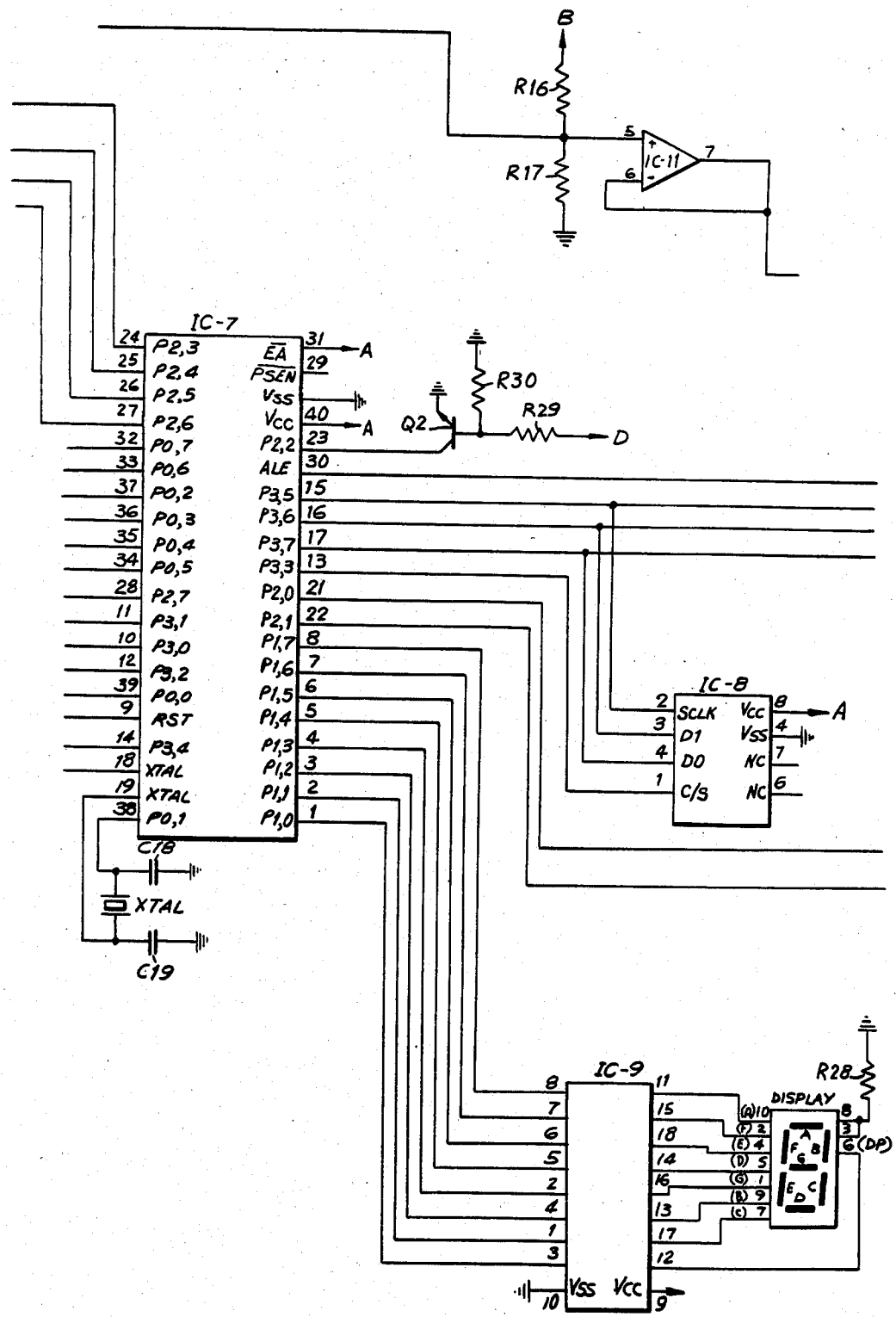

The 12 volt AC signal applied to connector J1 terminal D is also applied, via resistor R15 and transistor Q2, to the P3,4 input terminal of microcomputer IC-7 (FIG. 4b). Microcomputer IC-7 may be any suitable microcomputer such as an 8751H-8 EPROM microcomputer available from Intel Corporation of Santa Clara, Calif. This device includes a microprocessor, an onboard memory, and input/output ports. The AC signal applied to IC-7 terminal P3,4 is used to control a real-time clock function performed by IC-7.

The +5 volt output signal of IC-6 is applied to conventional reset device IC-5. IC-5 monitors the output signal of IC-6 to detect a power failure and to reset IC-7 via the RST terminal of IC-7 after power has been restored. The RS BAR output signal of IC-5 is applied to IC-3 and IC-7 to prevent any PLC signal transmission during a reset operation.

IC-3 is a conventional communications circuit for modulating and demodulating PLC signals. PLC signals received via connector J1 terminals 1 and A are amplified and applied to IC-3 via elements T2, R12, and Q1. Received PLC signals are demodulated by IC-3 and applied to terminal P3,0 of IC-7. These received PLC signals typically represent commands and/or data for controlling the operation of meter 10 as discussed in detail below. The ultimate source of these commands and/or data is typically a central facility of the utility company. Data to be transmitted via PLC signals is generated by IC-7 and applied to the TX terminal of IC-3. IC-3 uses this data to modulate a carrier signal applied to the I/O terminal of IC-3. The resulting PLC output signal is applied to J1 connector terminals 1 and A via resistor R12 and transformer T2 for transmission to a remote location. The remote location may be (1) one or more control elements on the premises served by meter 10, (2) a central facility of the utility company, or (3) other similar remote apparatus. Illustrative PLC signals transmitted by meter 10 include the above-described automatic meter readings.

The radiant energy sources 30a–e of Figures 1 and 2 are shown schematically in FIG. 4a as fmeter readings.

The radiant energy sources 30a–e of FIGS. 1 and 2 are shown schematically in FIG. 4a as five infrared light emitting diodes ("LEDs") D1–D5. Illumination of D1–D5 is controlled by IC-7. The P0,2 through P0,7 output signals of IC-7 are applied to IC-1 in parallel with conventional pull-up resistor network RN1. IC-1 is a conventional buffer. The P0,2 through P0,6 signals control illumination of D1–D5, while the P0,7 signal controls illumination of the LED in the REFLECTIVE SENSOR element also shown in FIG. 4a and discussed in detail below. The manner and sequence in which these devices are illuminated is discussed in detail below in relation to FIGS. 12–16. The output signals on IC-1 pins 11–15 are respectively applied to the cathodes of D3, D4, D5, D2, and D1 via connectors J2 and P2. The anodes of D1–D5 are connected in common to elements R1–R4 and IC-2 which collectively control the brightness of D1–D5 and the LED in the REFLECTIVE SENSOR under the control of the P2,3-P2,6 output signals of IC-7. IC-2 is a conventional eight-channel sourcing (open collector) buffer.

Figure 4C:
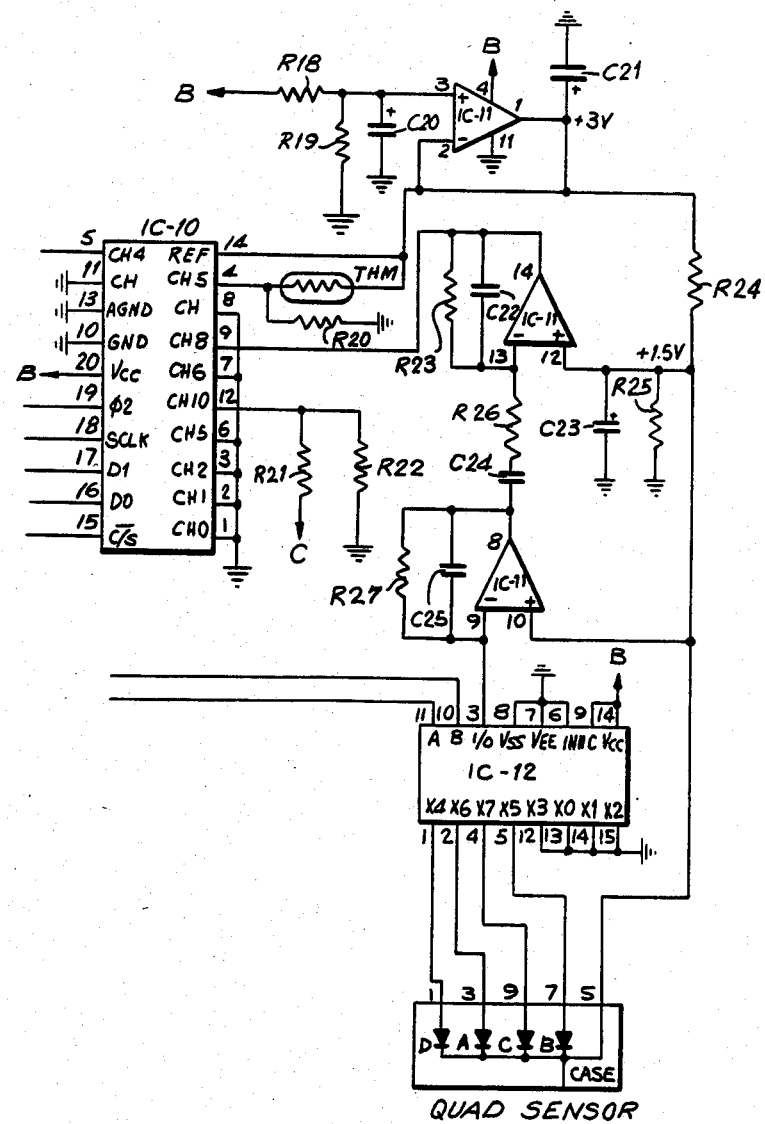

The sectored detector 60 of FIGS. 1 and 2 is shown in FIG. 4c as the QUAD SENSOR device. The four sectors of detector 60 are respectively represented by photo-sensitive diodes A-D in the QUAD SENSOR device. These four sectors are sampled one at a time in succession by conventional multiplexer device IC-12 under the control of the P2,0 and P2,1 output signals of IC-7. The sampling rate of diodes A-D is synchronized with the energization of LEDs D1–D5 so that the QUAD SENSOR sectors are sampled during multiple successive energizations of each LED. The manner and sequence in which the QUAD SENSOR sectors are sampled is discussed in more detail below in relation to FIGS. 12–16. The output signal of the QUAD SENSOR sector currently being sampled is pre-amplified by IC-11 operational amplifier 8-9-10. The rapidly time-varying component of the pre amplified by IC-11 operational amplifier 12-13-14. The output signal of post-amplifier 12-13-14 is applied to the CH8 input terminal of conventional multi-channel analog-to-digital (A/D) converter IC-10. When enabled by suitable chip and channel select signals from IC-7, IC-10 converts the analog signal applied to input terminal CH8 to a serial digital output signal applied to IC-7. IC-11 amplifier 1-2-3 supplies a +3 volt reference signal required by IC-10. Based on successive digital input signals representing the output signals of the four QUAD SENSOR sectors, IC-7 computes the angular position of the meter dial 12 associated with each disc 20. The angular position determining algorithm can be similar to that disclosed by Borrowes et al.

As mentioned above, the meter reading thus determined by IC-7 can be transmitted to another location by the above-described PLC signals. IC-7 applies a serial digital data signal representative of the meter reading to its P3,1 output terminal. IC-3 uses this digital data signal to modulate the PLC carrier signal applied to both phases of the 220 volt AC power signal circuit via transformer T2 and the power supply circuit of FIG. 3.

In addition to transmitting meter readings to remote locations via PLC signals, IC-7 transmits the meter reading information to conventional display driver IC-9 for use in controlling a conventional seven-segmnet plus decimal point DISPLAY device which is preferably visible to anyone observing the meter. The DISPLAY device successively displays decimal digits indicative of the complete meter reading, each decimal digit representing the angular position of a respective one of meter dials 12. The decimal digits are displayed in decimal order (most significantly first), and all segments of the DISPLAY (including the decimal point ("DP")) are illuminated after the least significant digit of each meter reading as DISPLAY test and framing information to enable the reader of the DISPLAY to determine the significance of the digits displayed.

The meter of this invention is also capable of reading the short-term power demand in the power circuit to which the meter is connected. This is accomplished by the REFLECTIVE SENSOR device shown in FIG. 4a, which corresponds to reflective sensor assembly 80 in FIGS. 1 and 2. The REFLECTIVE SENSOR includes a light emitting diode ("LED") for directing radiant energy to the surface of eddy current disc 16. Radiant energy reflected from the eddy current disc is detected by the photo-sensitive diode which is the other REFLECTIVE SENSOR component. Accordingly, the REFLECTIVE SENSOR can be used to detect the passage of the above-mentioned partially reflective mark or marks on the eddy current disc 16. The output signal of the REFLECTIVE SENSOR photodiode diode is amplified by IC-11 operational amplifier 5-6-7 for application to CH4 of IC-10. As in the case of the QUAD SENSOR output signals, IC-10 digitizes successive samples of the CH4 analog input signal and applies the resulting digital data signals to IC-7. IC-7 determines from these signals the number of times that the non-reflective mark on eddy current disc 16 passes the REFLECTIVE SENSOR in a predetermined time interval (e.g., 1 minute, 15 minutes, 30 minutes, etc.). On that basis, IC-7 computes the short-term power demand in the power circuit monitored by meter 10.

The above-described power demand determination can be used in several ways. For example, it is customary to place customers who are delinquent in paying for the electricity they have used on limited service in which the customer's demand is not to exceed a predetermined relatively small maximum (so-called LIFE LINE service). If the customer served by meter 10 is on LIFE LINE service, the permissible maximum demand value is transmitted to meter 10 via the above-described PLC signals and stored in IC-7. Thereafter, IC-7 continually compares the actual demand to the predetermined maximum, and if the maximum is exceeded, IC-7 produces P2,7 output signals applied to connector J1 LIFE LINE terminal 5 via IC-2 and IC-1 for controlling a conventional switching device (not shown) which cuts off all power to the customer. (LIFE LINE terminal 5 is normally high, and is pulled low by the above-described P2,7 output signal in order to trigger the LIFE LINE switching device.)

Another potential use of the above-described demand determination is to cut off certain customer apparatus in the event that the customer's demand exceeds a predetermined threshold value stored in IC-7. This feature can be used by the utility company to help reduce overall system demand peaks and to smooth out demand over time. The threshold value is transmitted to meter 10 via the above-described PLC signals and stored in IC-7. IC-7 compares the threshold value. If actual demand exceeds the threshold, IC-7 produces a P0,0 or P0,1 output signal which is applied, via conventional optical isolator IC-4, to connector J1 DEMAND CONTROL terminals C and 3 (FIG. 4a). These DEMAND CONTROL terminals are connected to a relay-type device (not shown) which cuts off power to one or more of the customer's electrical appliances, e.g., a hot water heater. Alternatively or in addition, control signals for shutting off power to selected devices can be applied by IC-7 to the above-described PLC channel. The actual demand data can also be applied to the PLC channel by IC-7.

The FIG. 4 circuitry also includes a thermistor THM (FIG. 4c) for monitoring the temperature in meter 10. Excessive meter temperature may indicate impending failure of the meter. A sudden change in meter temperature may indicate tampering with the meter. The analog output signal of thermistor THM is applied to IC-10 input terminal CH5 and converted to digital signals applied to IC-7 in the same manner as the QUAD SENSOR analog output signal is digitized and applied to IC-7. If the thermistor output signal changes rapidly or exceeds a predetermined threshold value, IC-7 sends out appropriate warning signals via the above-described PLC channel.

The following is a list of commercially available devices which can be used for the principal components shown in FIG. 4:

| Reference Number | Manufacturer | Manufacturer's Designation |
| --- | --- | --- |
| IC-1 | Sprague | ULN-2003A |
| IC-2 | Sprague | UDN-2585A |
| IC-3 | National Semiconductor | LM1893N |
| IC-4 | Litronix | 4N36 |
| IC-5 | Texas Instruments | TL7705A |
| IC-6 | Texas Instruments | 7805CK (78M05CKC) |
| IC-7 | Intel | 8751H-8 EPROM MICROCOMPUTER |
| IC-8 | National Semiconductor | NMC494 EEPROM 16 × 16 BIT |
| IC-9 | Sprague | UDN-2585A |
| IC-10 | National Semiconductor | ADC0811CN 11CH 8 BIT A/D W/HOLD |
| IC-11 | Texas Instruments | TLC27M4CN CMOS QUAD OP-AMP |

-continued

| Reference Number | Manufacturer | Manufacturer's Designation |
|---|---|---|
| IC-12 | RCA | CD4051BE CMOS 8CH ANALOG MUX |

Figure 12:
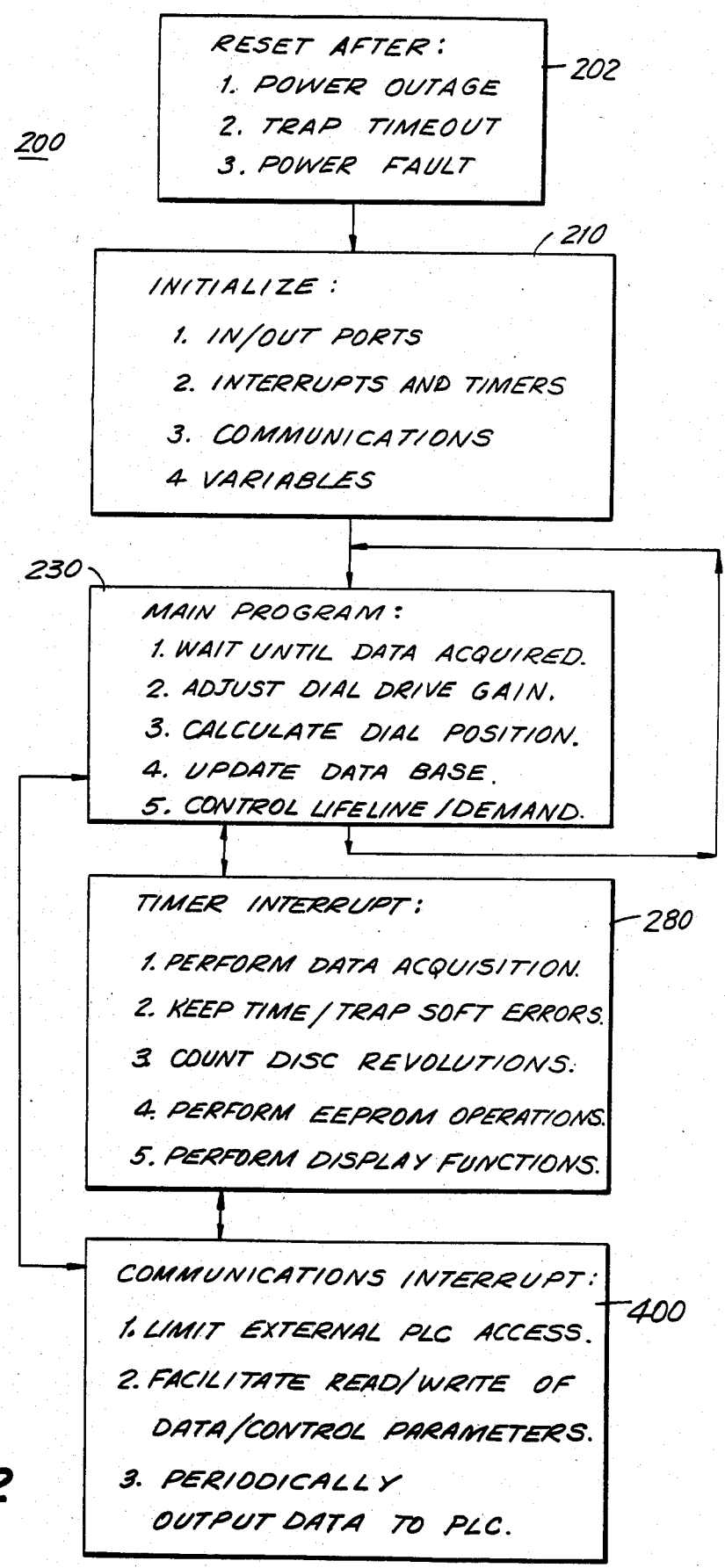
FIG. 12 is a flow chart of the operation of the microcomputer employed in the electronic circuitry of FIG. 4.

FIG. 12 shows the overall operating sequence 200 that IC-7 is programmed to perform. When the apparatus is started for the first time, or after any power outage, trap timeout, or power fault, processing begins with the resetting of IC-7 at step 202. (A trap timeout will occur if the IC-7 program becomes stalled for a period of time in excess of a predetermined trap timeout interval.) At step 210 IC-7 performs various initializaiton tasks including initializing its input and output ports, initializing its interrupts and timers. initializing its communications control information, and initializing various variables used throughout the program. Initialization routine 210 is shown in greater detail in FIG. 13. At step 230 IC-7 performs its main program loop which includes such tasks as waiting until data (e.g., QUAD SENSOR data) has been acquired, adjusting the drive current for LEDs 30, calculating the positions of meter dials 12, updating the stored data base, and controlling the LIFELINE and DEMAND CONTROL functions. Main program 230 is shown in greater detail in FIG. 16.

Main program 230 (or communications interrupt routine 400) is interrupted every 1.04166 . . . milliseconds by timer interrupt routine 280. This timer interrupt routine frequency synchronizes the 64 samples of each QUAD SENSOR sector (described below) with the 60 Hz power signal cycles in order to substantially cancel out the effects of any 60 Hz noise. (Each 60 Hz power signal cycle takes 16.6666 . . . milliseconds. 16.6666 . . . divided by 16 equals 1.04166 . . . .) Timer interrupt routine 280 (shown in greater detail in FIG. 14) performs such functions as dial reading data acquisition, keeping time, counting eddy current disc revolutions as a basis for short-term demand determinations, performing EEPROM operations, and performing display functions utilizing the FIG. 4b DISPLAY.

Communications interrupt routine 400 (shown in greater detail in FIG. 15) interrupts main program 230 (but not timer interrupt routine 280) whenever IC-3 signals that a byte of PLC data has been received or transmitted. Communications interrupt routine 400 performs such functions as limiting external PLC access to preclude tampering via the PLC channel with such data as the meter serial number and calibration factor, facilitating the reading and writing of data control parameters, and periodically outputting PLC data to be transmitted.

Figure 13:
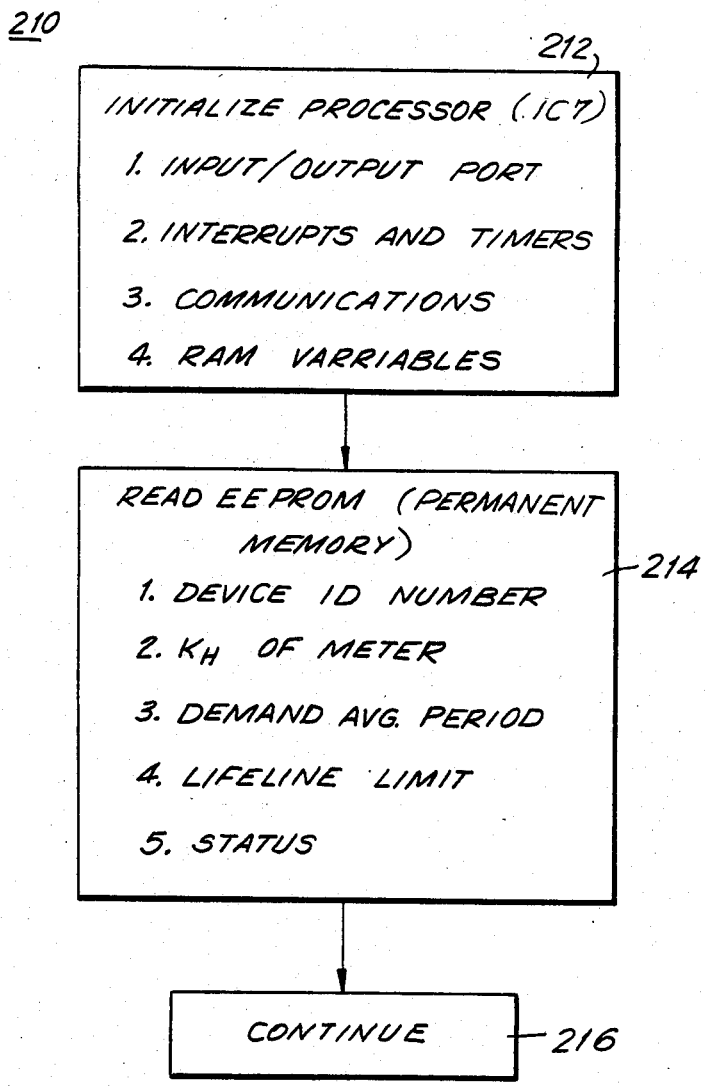
FIGS. 13, 14a-f, 15, and 16a-c are more detailed flow charts of portions of the FIG. 12 flow chart.

As mentioned above, initialization routine 210 is shown in more detail in FIG. 13. At step 212 the initialization operations mentioned above in connection with FIG. 12 are performed. At step 214 nonvolatile EEPROM memory IC-8 is read to retrieve such information as the identification number of the meter, the calibration factor of the meter, the time interval on which short-term demand determinations are to be based, the lifeline service limit, and the status of the meter. At step 216 control passes to main program 230.

Timer interrupt routine 280 is shown in greater detail in FIG. 14. The timer interrupt routine begins by storing (at step 282) the status of the interrupted routine (i.e., either main program 230 or communications interrupt routine 400). At step 284 a steering variable known as INTERRUPT COUNTER is tested, and if it is zero, control passes to step 286. Otherwise, control passes to step 292. At step 286 EE FLAG and UPDATE DIAL FLAG variables are tested. The EE FLAG variale is set during an EEPROM erase/write cycle. In order to conserve power during such a cycle, the reading of dials 12 is suspended, although the counting of eddy current disc revolutions continues. This ensures completion of an EEPROM erase/write cycle even if a power outage has occurred. The UPDATE DIAL FLAG variable is set after sufficient data has been gathered to allow computation of the angular positions of dials 12. While the UPDATE DIAL FLAG is set, no further dial reading data is gathered. If at step 286 neither the EE FLAG nor the UPDATE DIAL FLAG variable is found to be set, control passes to step 288. Otherwise control passes to step 314.

At step 288 the brightness control data for the LED associated with the dial 12 to be read is applied to IC-2. Then the appropriate LED is activated via IC-1. After a time delay, one QUAD SENSOR sector or quadrant is sampled (a so-called "light" sample) and the resulting data is added to the buffer which accumulates data for that QUAD SENSOR sector. Lastly, the SAMPLE COUNTER variable is incremented and control passes to step 290 in which the termperature of the meter is read using thermistor THM. Control then passes to step 314.

If at step 284, the INTERRUPT COUNTER variable was found to be other than zero, control passes to step 292 where the INTERRUPT COUNTER variable is tested again. If found to be one, control passes to step 294 where the EE FLAG and UPDTE DIAL FLAG variables are tested. Otherwise, control passes to step 300. If at step 294 neither the EE FLAG nor the UPDATE DIAL FLAG variable is found to be set, control passes to step 296. Otherwise, control passes to step 314.

At step 296 all of LEDs 30 are turned off. Then there is a time delay, after which one QUAD SENSOR sector or quadrant is sampled (a so-called "dark" sample) and the resulting data is subtracted from the buffer which accumulates data for that QUAD SENSOR sector. Thereafter, the SAMPLE COUNTER variable is incremented and control passes to step 298 where the power supply voltage level is read to ensure that an EEPROM erase/write cycle is not allowed to begin unless there is sufficient energy stored in capacitor C14 to complete that cycle. Control then passes to step 314.

If at step 292 the INTERRUPT COUNTER variable was found to be other than one, control passes to step 300 where the INTERRUPT COUNTER variable is tested again. If found to be two, control passes to step 302. Otherwise, control passes to step 312.

At step 302 the REFLECTIVE SENSOR associated with eddy current disc 16 is read with the REFLECTIVE SENSOR LED off to produce a so-called "dark" sample, and that sample is subtracted from the buffer which accumulates data for the eddy current disc. At step 304 the power supply voltage level is read as at step 298. At step 306 the brightness control data for the REFLECTIVE SENSOR LED is applied to IC-2, the REFLECTIVE SENSOR LED is illuminated via IC-1, and the eddy current DISC READ COUNTER variable is incremented. At step 308 the modulo 64 SAMPLE COUNTER variable is tested and if it is zero. multiplexer IC-12 is reset to collect data from the next QUAD SENSOR sector or quadrant to be sampled. Control then passes to step 314. If the SAMPLE COUNTER variable is not zero at step 308, control passes directly to step 314. Accordingly, 64 alternating "light" and "dark" samples are taken of each QUAD SENSOR sector in order to determine the position of each dial 12.

Figure 14A:
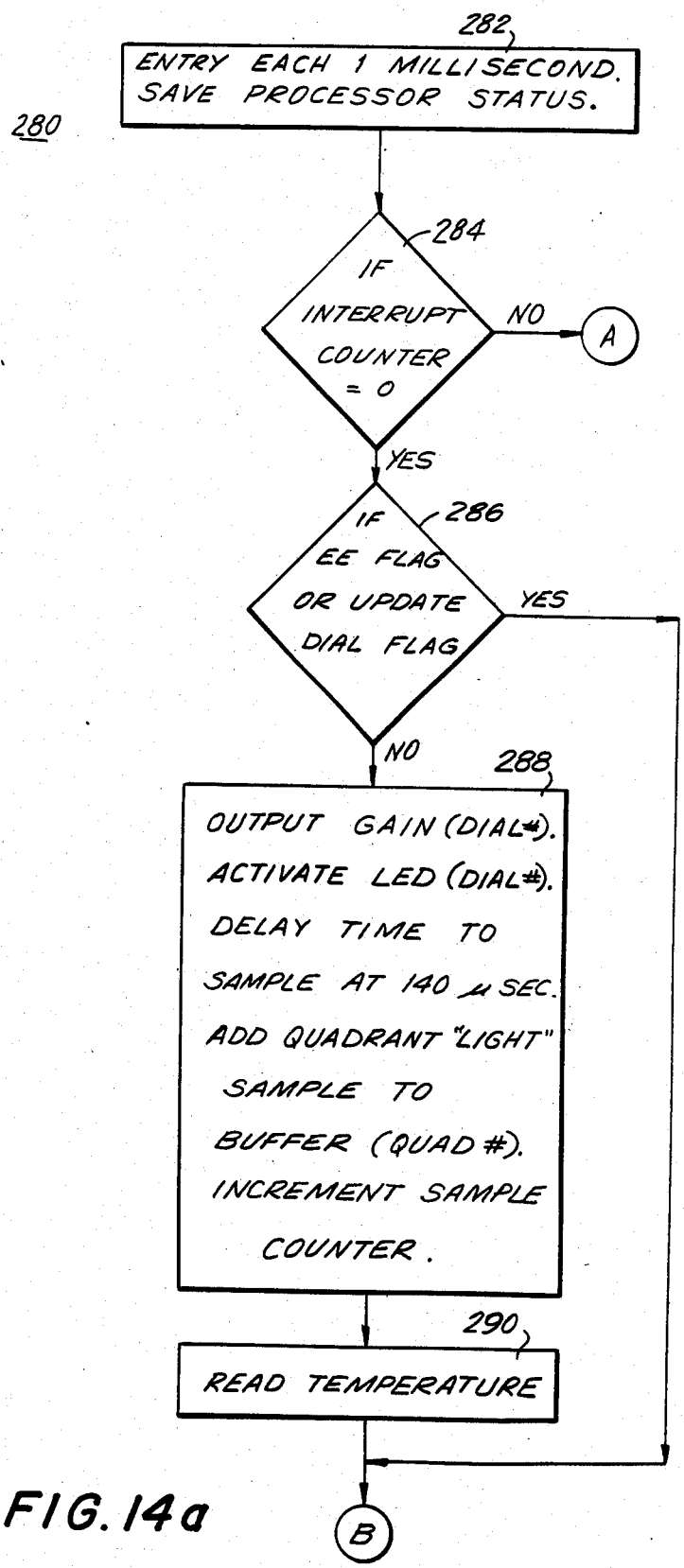
Figure 14B:
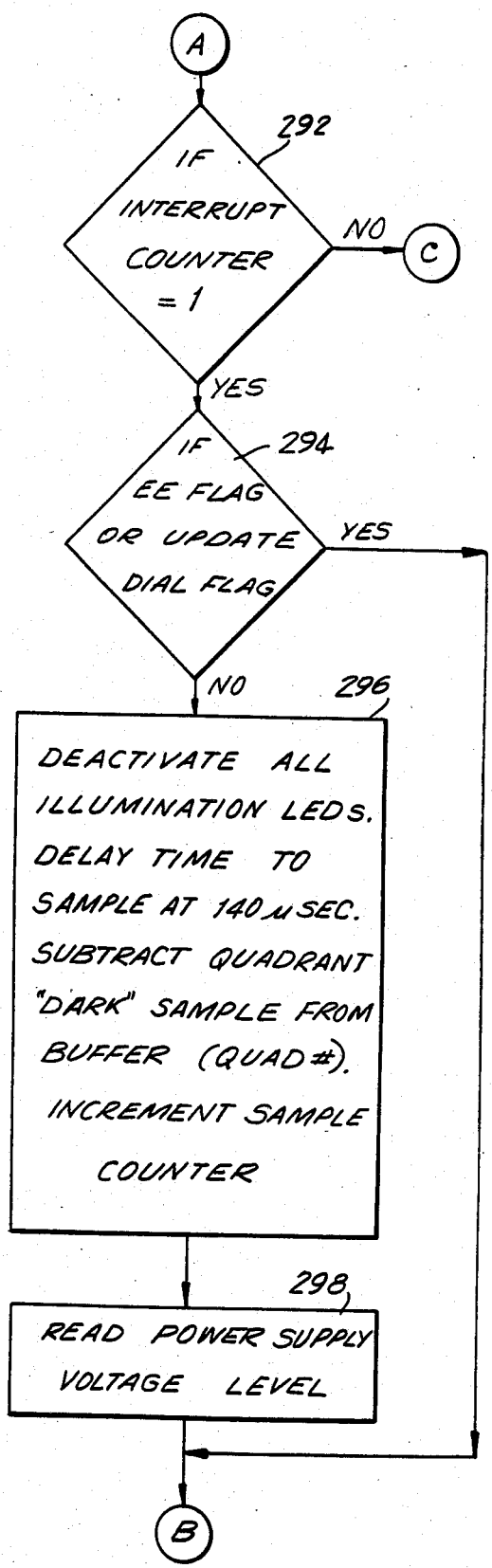
Figure 14C:
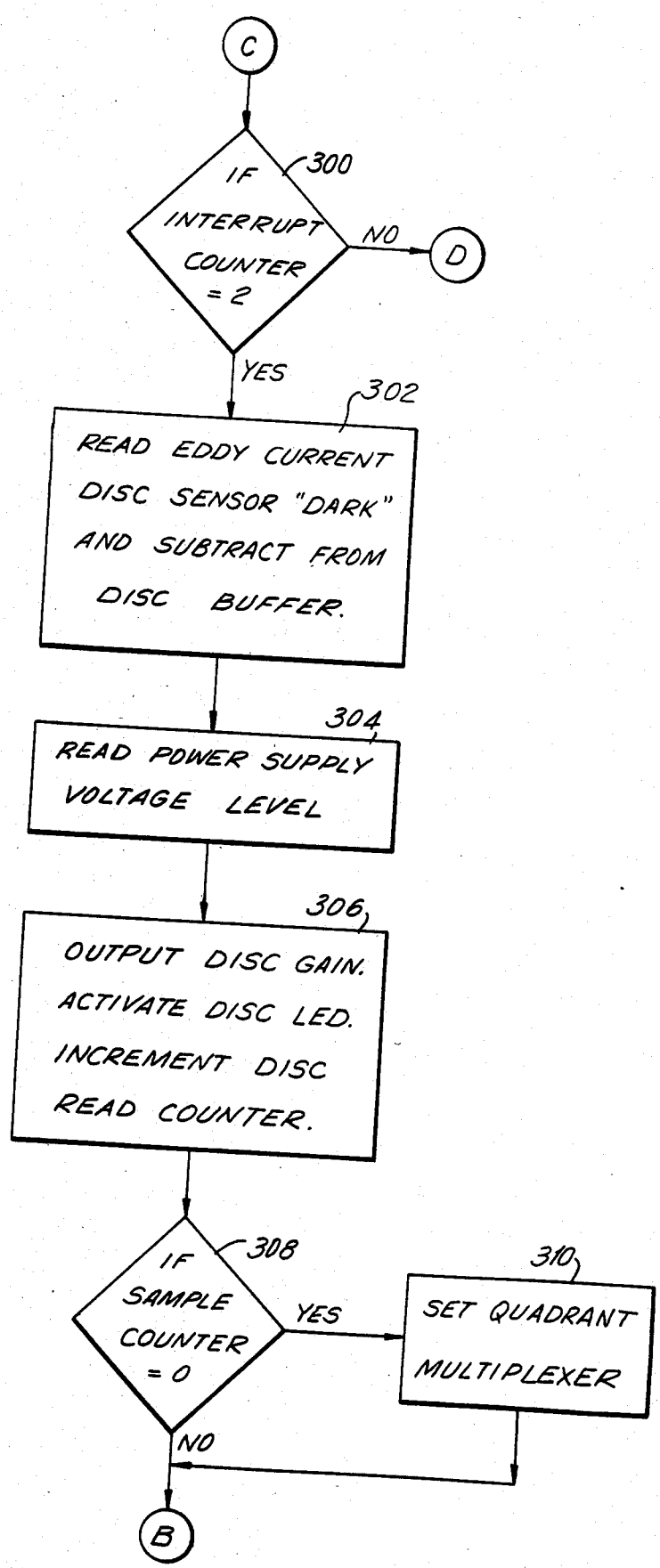
Figure 14D:
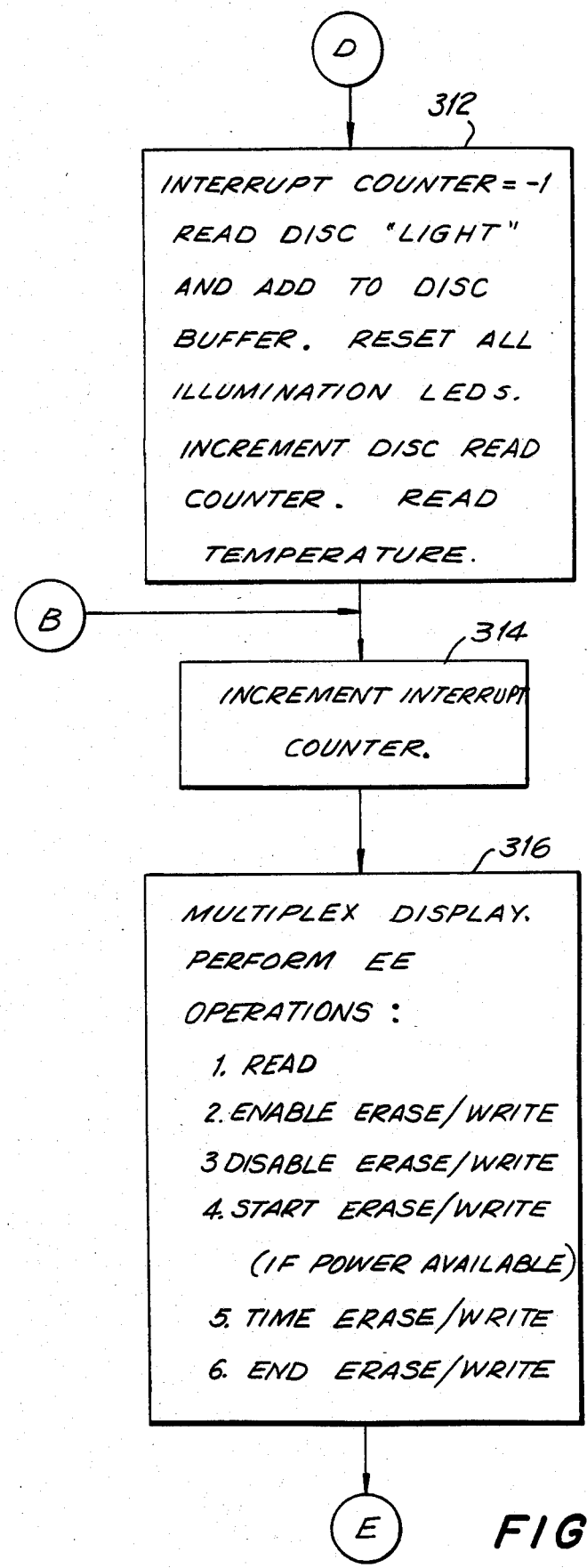
Figure 14E:
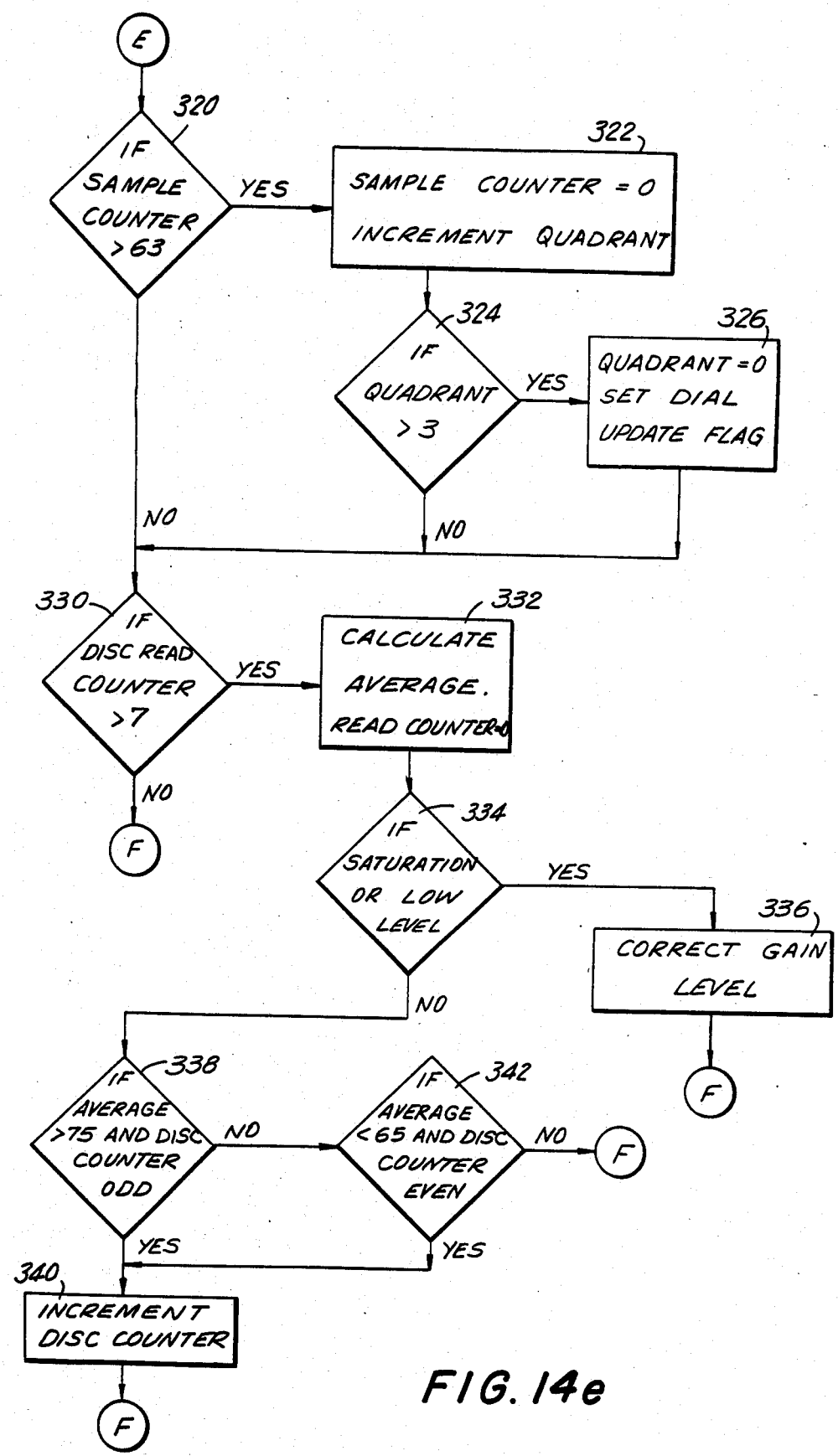
Figure 14F:
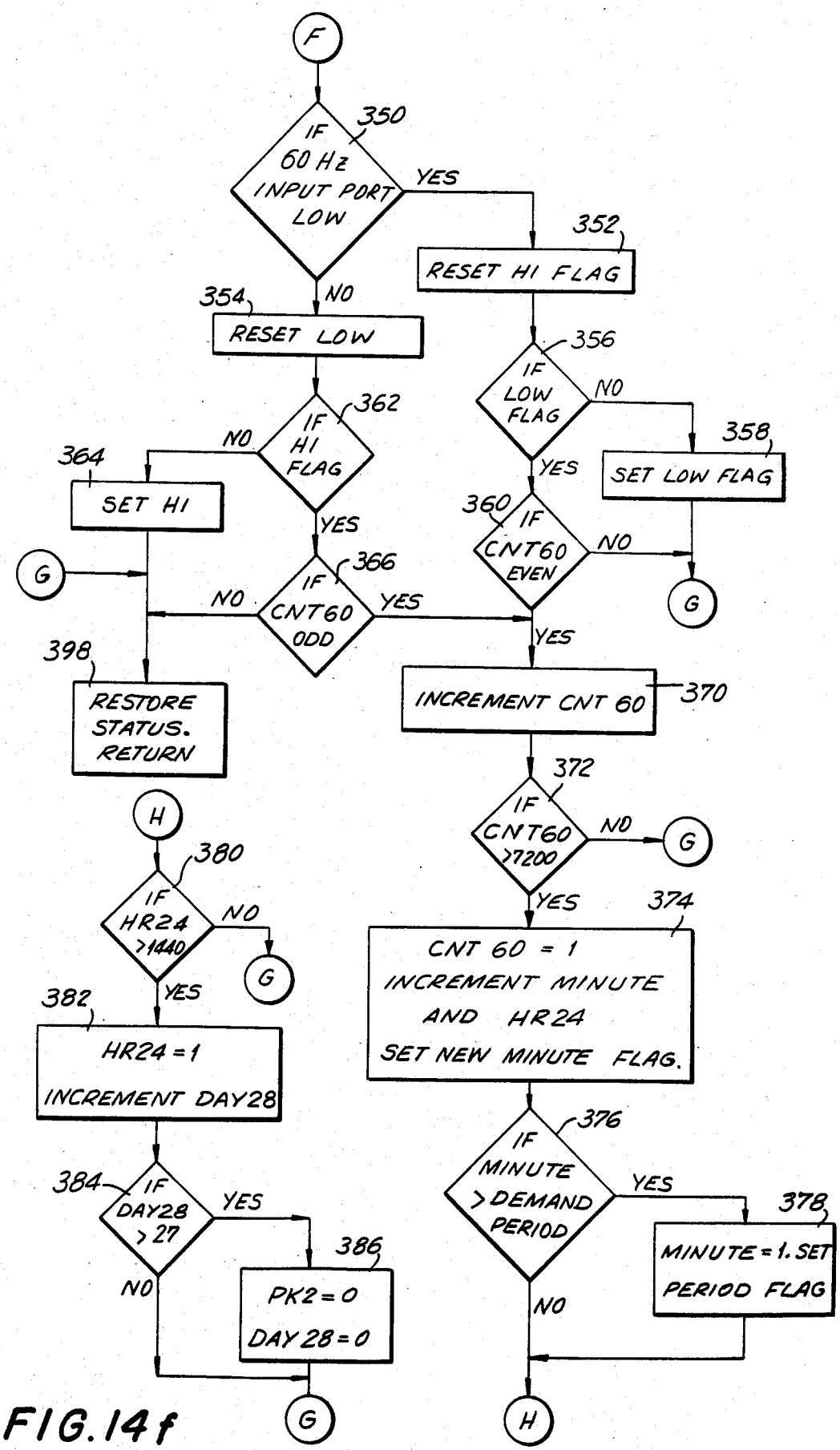

If at step 300 the INTERRUPT COUNTER variable was found to be other than two, then control passes to step 312 where the INTERRUPT COUNTER variable is set to minus 1. Also at step 312 the REFLECTIVE SENSOR LED is sampled (with the associated LED on as described above in connection with step 306) and the resulting "light" sample is added to the buffer which accumulates data for eddy current disc 16. Thereafter, all illumination LEDs are turned off via IC-1, the DISC READ COUNTER variable is incremented, and the temperature of the meter is read via thermistor THM. At step 314 the INTERRUPT COUNTER variable is incremented, At step 316 data is sent to display driver IC-9 to cause the DISPLAY device to display either a decimal point with an 8 (as a DISPLAY test pattern and framing indication) or a decimal digit indicative of the angular position or a desired one of dials 12. Thereafter, a desired one of the EEPROM operations listed in FIG. 14d is performed. The READ operation allows data to be read from any desired EEPROM location. The ENABLE ERASE/WRITE operation takes the EEPROM out of its normal DISABLE ERASE/WRITE condition (which protects the EEPROM from transients during abnormal conditions such as a power failure). The START ERASE/WRITE operation initiates an erase/write cycle to allow data in the EEPROM to be altered. An erase/write cycle is allowed to begin only if there is sufficient energy stored in capacitor C14 to complete it. After performing the desired EEPROM operation, control passes to step 320.

At step 320 the SAMPLE COUNTER variable is tested, and if it is greater than 63, control passes to step 322. Otherwise, control passes to step 330. At step 322 the SAMPLE COUNTER variable is set to zero and the QUADRANT variable is incremented. At step 324 the QUADRANT variable is tested, and if it is greater than 3, control passes to step 326. Otherwise, control passes to step 330. At step 326 the QUADRANT variable is set to zero and the DIAL UPDATE FLAG is set. Control then passes to step 330.

At step 330 if the DISC READ COUNTER variable is greater than seven, control passes to step 332. Otherwise, control passes to step 350. At step 332 the contents of the eddy current disc buffer are divided by four to compute an AVERAGE and the DISC READ COUNTER variable is reset to zero. Accordingly, the AVERAGE is the average of the difference between four "light" and four "dark" samples of eddy current disc 16. At step 334, if the AVERAGE value determined in step 332 indicates that the REFLECTIVE SENSOR is saturated, then control passes to step 336 where the data controlling the brightness of the REFLECTIVE SENSOR LED is immediately lowered. Control then passes to step 350. Similarly, at step 334, if the AVERAGE indicates that the REFLECTIVE SENSOR is at too low a level for an extended period (e.g., 20 minutes), then at step 336 the data controlling the brighness of the REFLECTIVE SENSOR LED is increased and control passes to step 350. This latter type of adjustment is made only after a time delay so that if eddy current disc 16 is moving very slowly, the prolonged exposure of the REFLECTIVE SENSOR to a non-reflective mark on the disc will not result in a gain adjustment.

If step 334 does not indicate any requirement for adjustment of LED brightness, then control passes to step 338 where the AVERAGE from step 332 is compared to an upper threshold value of 75. If the AVERAGE is greater than 75 (indicating that the REFLECTIVE SENSOR is not adjacent a non-reflective mark on eddy current disc 16) and the DISC COUNTER variable is odd (indicating that a non-reflective mark was adjacent the REFLECTIVE SENSOR the last time the DISC COUNTER variable was incremented), then the DISC COUNTER is incremented at step 340 to record the transition from a non-reflective area to a reflective area on the eddy current disc. Thereafter, control passes to step 350. If step 338 produces a negative result, then control passes to step 342. At step 342 the AVERAGE from step 332 is compared to a lower threshold value of 65. If the AVERAGE is less than 65 (indicating that the REFLECTIVE SENSOR is adjacent a non-reflective mark on eddy current disc 16) and the DISC COUNTER variable is even (indicating that no non-reflective mark was adjacent the REFLECTIVE SENSOR the last time the DISC COUNTER variable was incremented), then the DISC COUNTER variable is incremented at step 340 to record the transition from a reflective area to a non-reflective area on the eddy current disc. Thereafter, control passes to step 350. If step 342 produces a negative result, control passes directly to step 350.

Step 350 begins the processing of the 60Hz power signal to control the real time clock variables stored in IC-7. At step 350 the 60 Hz input port P3,4 is tested. If it is low, the HI FLAG variable is reset at step 352. Otherwise, the LOW FLAG variable is reset at step 354. From the step 352 control passes to step 356 where the LOW FLAG variable is tested. If the LOW FLAG is not set, then it is set at step 358 and control passes to step 398 where timer interrupt routine 280 ends by restoring the status of the program interrupted at the start of the timer interupt routine and by returning to that program. If at step 356 the LOW FLAG variable is found to be set, control passes to step 360 where the CNT60 variable is tested. If CNT60 is odd, control passes to step 398 described above. If CNT60 is even, control passes to step 370 where CNT60 is incremented.

Returning to step 354, after that step, the HI FLAG variable is tested at step 362. If found to be reset, HI FLAG is set at step 364, after which control passes to step 398 described above. If at step 362, HI FLAG is found to be set, control passes to step 366 where CNT60 is tested. If CNT60 is even, control passes to step 398 described above. Otherwise, control passes to step 370 where CNT60 is incremented as described above.

After step 370, CNT60 is tested at step 372. If CNT60 is greater than 7200 (the number of 60 Hz zero axis crossings in one minute), control passes to step 374. Otherwise control passes to step 398 described above.

At step 374 CNT60 is reset to one, the MINUTE and HR24 variables are incremented, and the NEW MINUTE FLAG is set. At step 376 the MINUTE variable is compared to the DEMAND PERIOD variable, which is the predetermined number of minutes (usually 15, 20, 30, 40, or 60) on which short-term demand determinations for billing purposes are made. If the MINUTE variable is less than or equal to the DEMAND PERIOD variable, control passes to step 380. On the other hand, if the MINUTE variable is greater than the DEMAND PERIOD variable, then at step 378 the MINUTE variable is reset to one and the PERIOD FLAG is set to indicate that a short-term demand determination should be made. Control then passes to step 380.

At step 380 the HR24 variable is compared to 1440 (the number of minutes in a 24 hour day). If HR24 is less than or equal to 1440, control passes to step 398 described above. Otherwise control passes to step 382 where the HR24 variable is reset to 1 and the DAY28 variable is incremented. At step 384 the DAY28 variable is compared to 27. If DAY28 is less than or equal to 27, control passes to step 398 described above. If DAY28 is greater than 27, control passes to step 386 where the PK2 (PEAK2) and DAY28 variables are set to zero. PK2 and PK1 (discussed below) are two similar variables related to the customer's peak short-term demand and on which the customer's bill for service may be based in part. PK1 can be cleared or reset periodically via the PLC channel. PK2 can only be altered by physical access to the circuitry of the meter. It is reset internally every 28 days based on the above-described DAY 28 variable. Periodic comparison of PK1 and PK2 can be used to detect unauthorized tampering with PK1.

Figure 15:
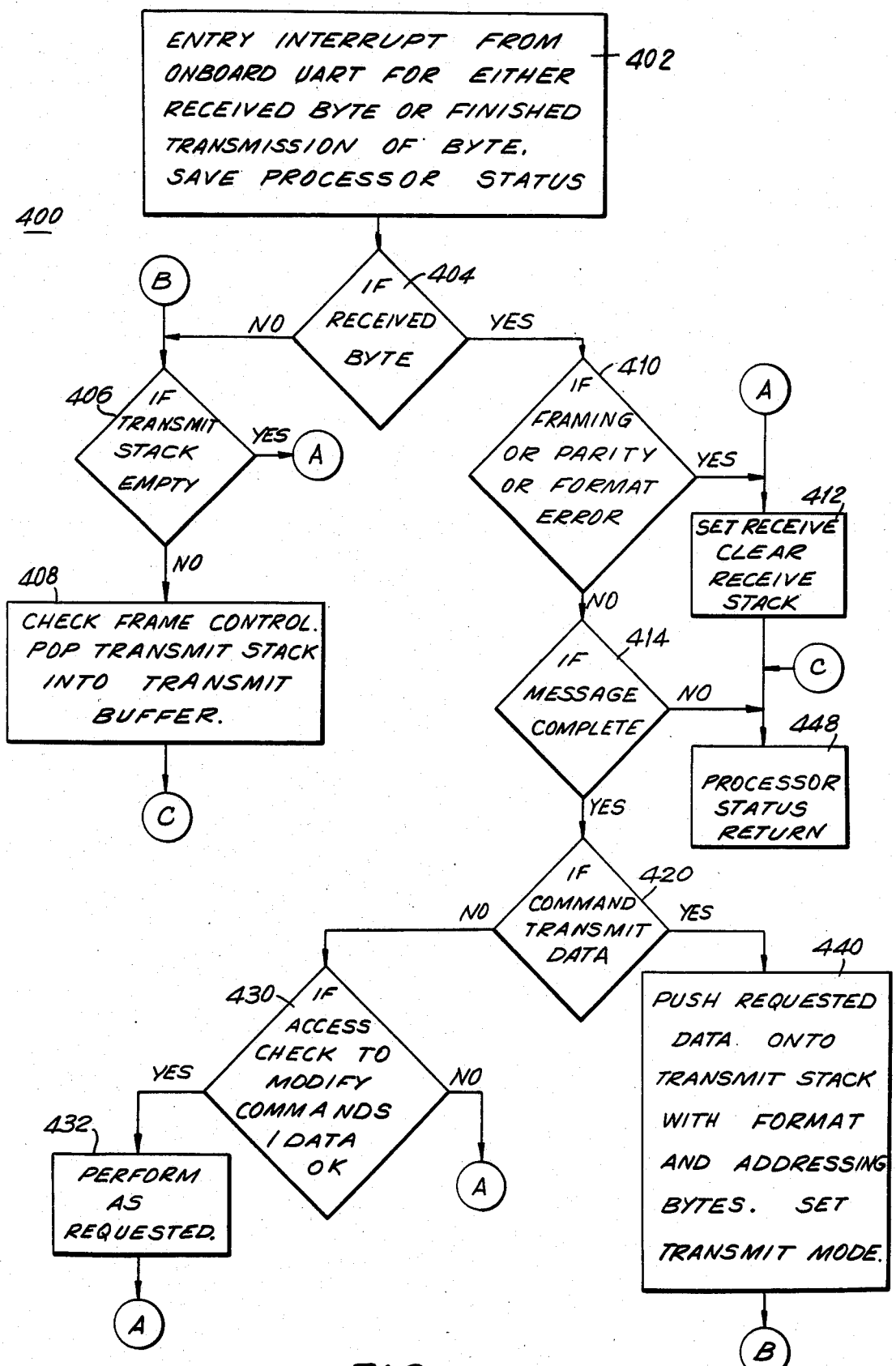

Communications interrupt routine 400 is shown in greater detail in FIG. 15. As indicated at step 402, main program 230 (but not timer interrupt routine 280) is interrupted by communications interrupt routine 400 whenever IC-3 indicates either that a byte of transmitted data has been received or that it has finished transmitting a byte of data. The status of main program 230 is saved so that processing of the main program can be resumed when processing of the communications interrupt routine is complete. At step 404 it is determined whether the communications interrupt routine was initiated by completion of a data transmission (control passes to step 406) or completion of a data reception (control passes to step 410). At step 406 it is determined whether or not all of the data to be transmitted has been transmitted. If so, control passes to step 412. Otherwise, in step 408, the next byte to be transmitted is transferred to the transmit buffer and control passes to step 448 which ends the communications interrupt routine and causes main program 230 to resume where last interrupted.

At step 410 the received data is tested for various errors, and if any such errors are found, control passes to step 412. At step 412 the apparatus is set to receive and the reeive stack is cleared. Control then passes to step 448 described above. If no errors are found in the received data, control passes from step 410 to step 414 where the received message is tested for completeness. If the received message is not complete, control passes to step 448 described above. Otherwise control passes to step 420 in which the received message is tested to determine whether or not it is a command to transmit data. If not, control passes to step 430 in which the received message is tested to determine whether or not it is valid for modifying the commands and/or data stored in IC-7. If the message is valid, then at step 432 the requested function is performed and control passes to step 412 described above. If at step 430 the received message is found invalid, then control passes directly to step 412.

If at step 420 the received message is found to be a command to transmit data, then control passes to step 440 in which the requested data is transferred to the transmit stack with format and addressing bytes and the apparatus is set to transmit. Control then passes to step 406 and processing continues as described above.

Figure 16A:
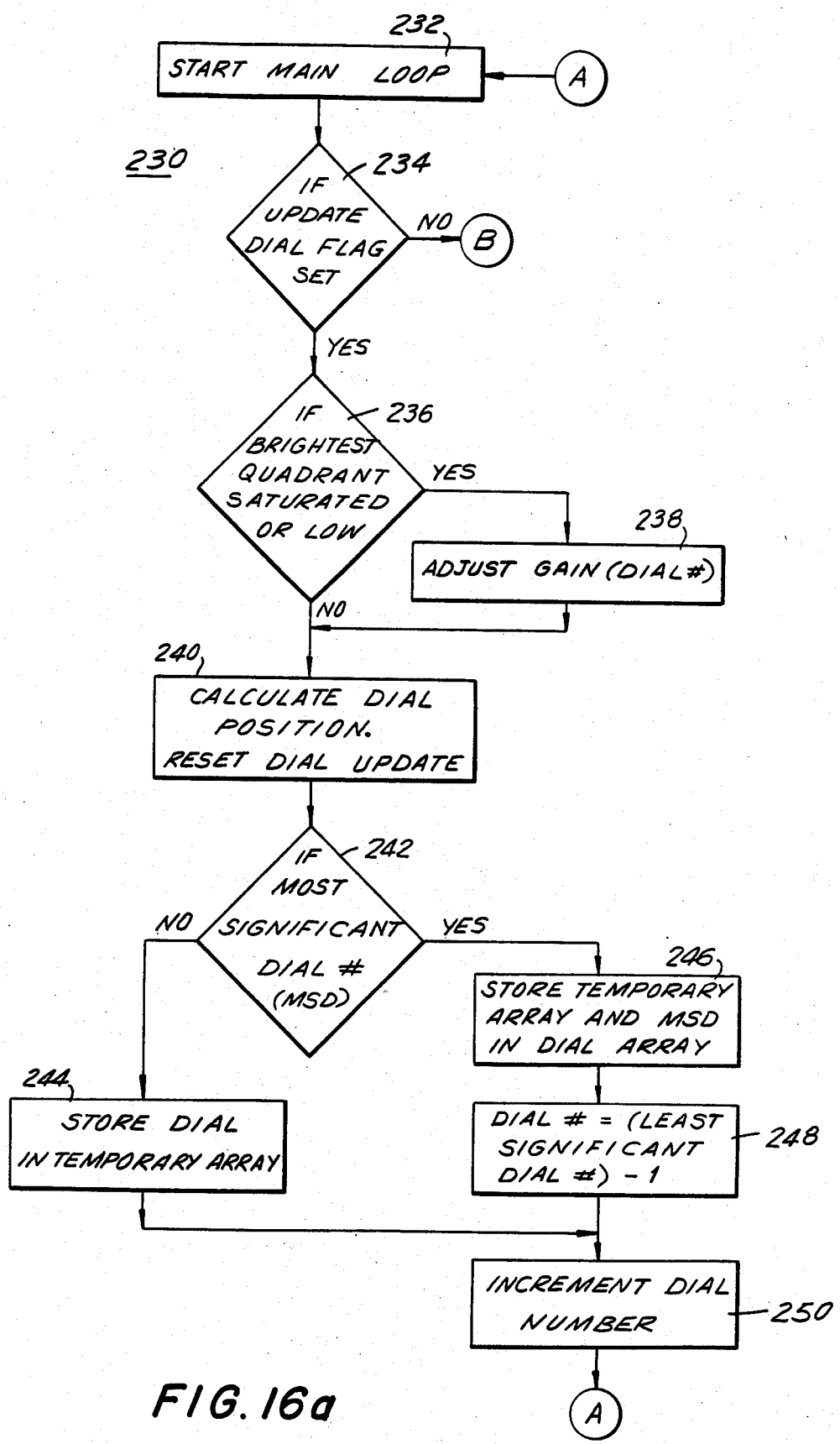
Figure 16B:
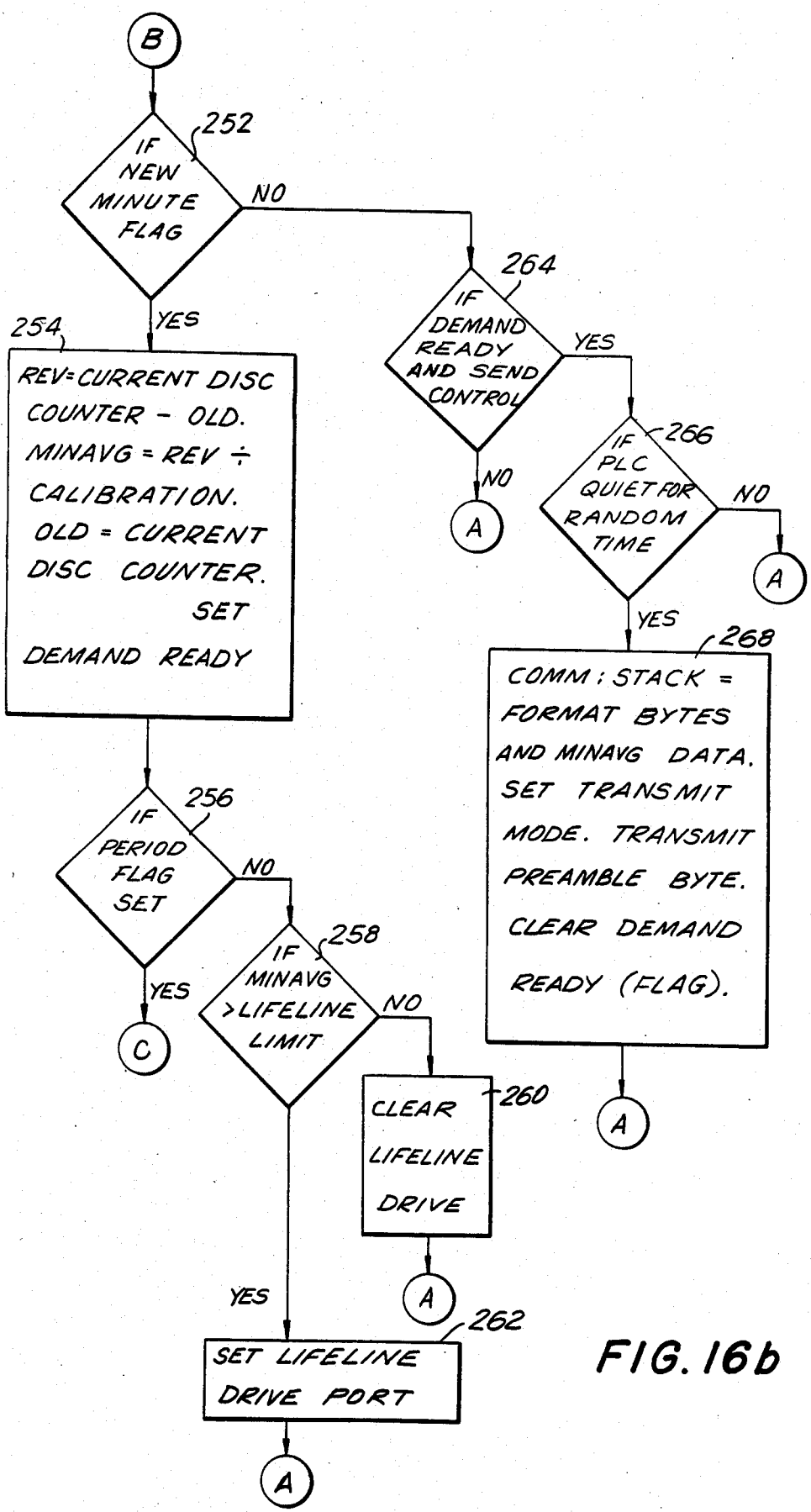
Figure 16C:
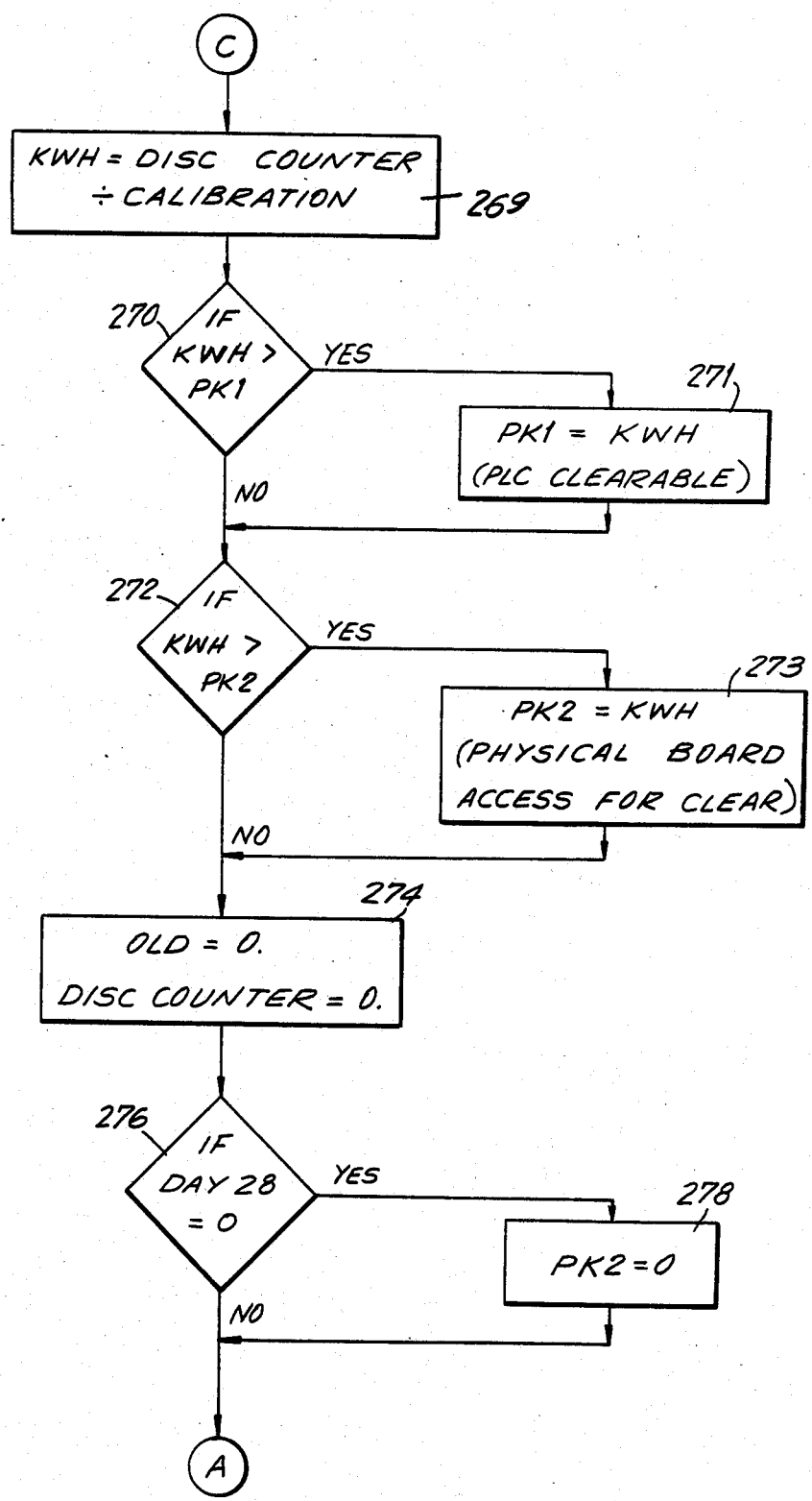

Main program 230 is shown in greater detail in FIG. 16 and begins at step 232. At step 234 the UPDATE DIAL FLAG variable is tested. If it is set, indicating that it is time to recompute the angular position of one of dials 12, control passes to step 236. Otherwise control passes to step 252. At step 236 the accumulated data from the brightest QUAD SENSOR sector is tested to determine whether that data indicates that the associated LED 30 is either too bright (producing saturation of the QUAD SENSOR) or not bright enough. If step 236 produces a positive result, then the data controlling the brightness of that LED 30 is appropriately adjusted at step 238 and control passes to step 240. Otherwise control passes directly from step 236 to step 240.

At step 240 the accumulated QUAD SENSOR data is used to calculate the angular position of the dial 12 associated with that data. The algorithm used can be similar to that taught by Burrowes et al.

At step 242 it is determined whether or not the dial whose angular position was just calculated is the most significant dial ("MSD"). If not, the dial reading is stored in a temporary array in step 244 and control then passes to step 250 where the dial number is incremented to begin the accumulation of QUAD SENSOR data for the next most significant dial. If the dial is the most significant dial, then in step 246 the temporary array and the most significant dial reading are stored in a dial array, and in step 248 the dial number is preset to allow the dial reading process to begin again.

At step 252 the NEW MINUTE FLAG variable is tested to determine whether a minute has elapsed since the customer's MINAVG (MINUTE AVERAGE) demand for servie was last calculated. If so, control passes to step 254 where the customer's demand over the last one minute time interval is calculated as follows: The OLD variable (determined as described below) is subtracted from the current DISC COUNTER value to determine the REV variable which equals the number of eddy current disc revolutions in the minute which has just elapsed (assuming that there is only one non-reflective mark on eddy current disc 16). The REV value is divided by an appropriate predetermined meter calibration factor to compute the MINAVG variable. The MINAVG variable is used to control the customer's LIFELINE and DEMAND CONTROL devices, if any. Finally, the OLD variable is set equal to the current DISC COUNTER variable, the DEMAND READY flag is set to indicate that demand data is available for transmission if desired, and control passes to step 256.

At step 256 the PERIOD FLAG is tested, and if it is set, control passes to step 269. If the PERIOD FLAG is not set, control passes to step 258 in which the just-computed MINAVG variable is compared to the customer's LIFELINE LIMIT. If the LIFELINE LIMIT has not been exceeded, then in step 260 the data which controls the LIFELINE device (if present) is cleared to allow the customer to continue to receive service and the main program starts again with step 232. If the LIFELINE LIMIT has been exceeded, then in step 262 the data controlling the LIFELINE device is set to cut off the customer's service and the main program starts again with step 232. DEMAND CONTROL devices, if any, can be controlled in a manner similar to LIFE-LINE service.

Returning to step 252, if the NEW MINUTE FLAG is found not to be set, control passes to step 264 in which the DEMAND READY and SEND CONTROL variables are tested. If both of these variables are set, control passes to step 266. Otherwise the main program begins again with step 232.

At step 266 the status of the PLC channel is tested and if it is found to have been quiet for a time, control passes to step 268. Otherwise the main program begins again with step 232. At step 268 the communications stack is loaded with appropriate format bytes and demand data, the apparatus is switched to the transmit mode, a preamble byte is transmitted, and the DEMAND READY flag is cleared. The main program then begins again with step 232.

At step 269 the KWH variable is computed by dividing the DISC COUNTER variable by an appropriate predetermined meter CALIBRATION factor. The KWH variable is therefore the short-term demand for the DEMAND PERIOD which has just elapsed. Control then passes to step 270 in which KWH is compared to PK1. If KWH is greater than PK1, PK1 is set equal to KWH in step 271 and control passes to step 272. Otherwise control passes directly from step 270 to step 272. Steps 272 and 273 are similar to steps 270 and 271 except that PK2 is used instead of PK1. At step 274 the OLD and DISC COUNTER variables are set equal to zero. At step 276 the DAY28 variable is tested to determine whether or not 28 days have elapsed since PK2 was last reset to zero, and if so, PK2 is set equal to zero at step 278. Otherwise main program 230 begins again with step 232.

FIGS. 7-10 illustrate a particularly preferred optical system 140 for directing radiant energy from each of a plurality of side-by-side discs 20 (e.g., five discs 20a-e) to single sensor location 50. Optical system 140 is molded as a single piece of plastic material such as polycarbonate which is preferably tinted so that it passes substantially only the frequency of radiation emitted by LEDs 30. This helps reduce the effect of ambient light on the QUAD SENSOR at location 50. Optical system 140 includes five circular convex lenses 142a-e, each of which is disposed along the axis 144a-e between the associated disc 20 and location 50. Each lens 142 is inclined so that its optical axis is coincident with the associated axis 144, and each lens 142 is shaped to focus the image of the associated disc 20 at location 50.

Figure 8:
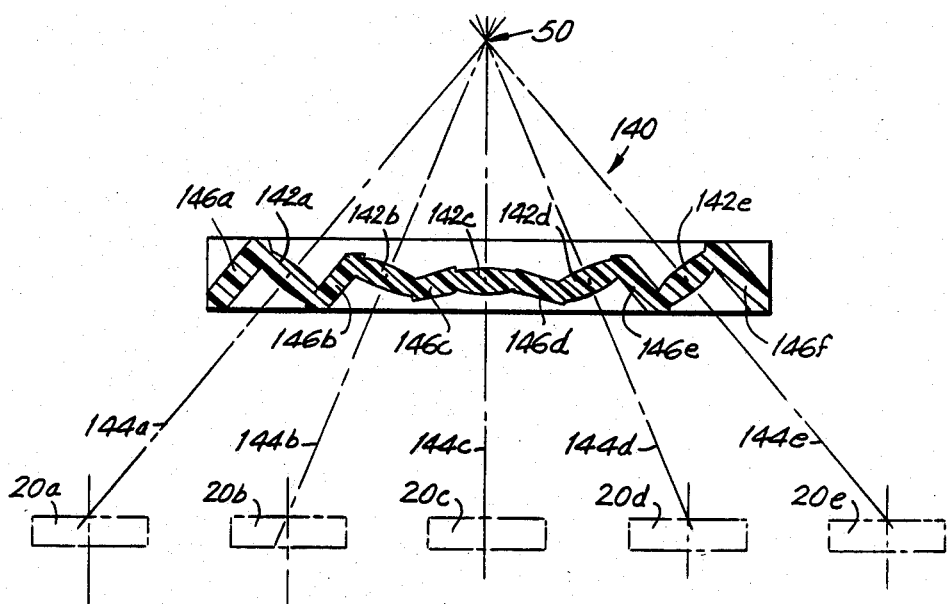
FIG. 8 is a cross sectional view taken along the line 8—8 in FIG. 7.
Figure 9:
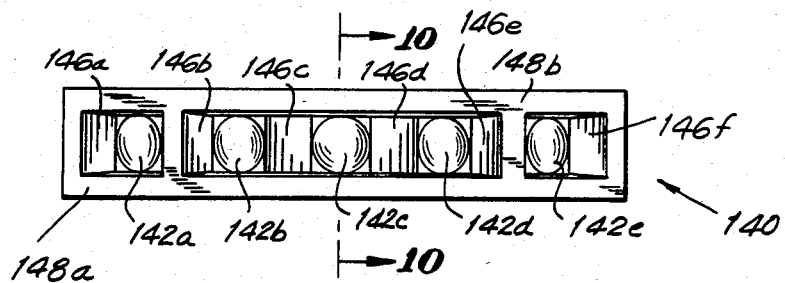
FIG. 9 is an elevational view of the apparatus of FIGS. 7 and 8 taken in the opposite direction from FIG. 7.
Figure 10:
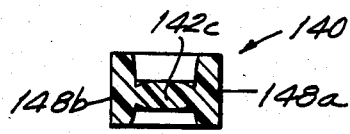
FIG. 10 is a cross sectional view taken along the line 10—10 in FIG. 9.

As is best seen in FIG. 8, there are web portions 146a-f between adjacent lenses 142. Optical assembly 140 is bilaterally symmetrical about the line 10—10, and also about the line 8—8. The structural rigidity of optical assembly 140 is enhanced by integral rails 148a and b which run along each side of the assembly.

The above-described one-piece plastic lens assembly substantially lowers the manufacturing and assembly costs of the optical portion of the apparatus of this invention.

We claim:

1. Apparatus for reading a meter having a plurality of rotating dials comprising:
a plurality of patterned discs, each of which is mounted for rotation with a respective one of the dials, each disc having sectors of different radiant energy attenuating properties so that radiant energy directed to the disc is encoded by the sectored pattern;
first means for directing radiant energy to each of the discs one at a time in succession;
second means for directing the encoded radiant energy from each disc to a single sensor location;
a sectored detector disposed at the sensor location so that each detector sector receives a portion of the encoded radiant energy from the second means and produces a detector sector output signal indicative of the intensity of the received radiant energy; and
third means for processing the detector sector output signals to produce dial reading output signals indicative of the angular position of each of the discs.

2. The apparatus defined in claim 1 wherein the meter is connected to an electrical power distribution network and wherein the apparatus further comprises:
means for applying, to the power distribution network for distribution via that network, data signals indicative of the dial reading output signals.

3. The apparatus defined in claim 1 wherein the first means comprises:
a plurality of radiant energy sources, each source being adapted to direct radiant energy to a respective one of the discs; and
means for energizing the radiant energy sources one at a time in succession.

4. The apparatus defined in claim 3 wherein each radiant energy source is an optical radiant energy source.

5. The apparatus defined in claim 4 wherein the second means comprises a plurality of lenses, each lens being adapted to direct encoded radiant energy froma respective one of the discs to the sensor location.

6. The apparatus defined in claim 1 wherein the third means comprises multiplexing means for sampling the detector sector output signals one at a time in succession, each detector sector output signal being sampled at least once while the first means is directing radiant energy to each disc.

7. The apparatus defined in claim 6 wherein the first means directs radiant energy to each of the discs intermittently, wherein the multiplexing means samples each detector sector output at least once while the radiant energy is on to produce a light sample and at least once while the radiant energy is off to produce a dark sample, and wherein the third means further includes means for subtracting each dark sample from the associated light sample to produce net samples on which the dial reading output signals are based.

8. The apparatus defined in claim 7 wherein the multiplexing means takes multiple alternating light and dark samples of each detector sector output signal while the first means is intermittently directing radiant energy to each disc.

9. The apparatus defined in claim 1 further comprising:
display means for visually displaying symbolic information representative of the dial reading output signals.

10. The apparatus defined in claim 9 wherein the display means displays symbolic information representative of the angular positions of the dials one at a time in a recurrent succession, and wherein the apparatus further comprises:
fifth means for causing the display means to display a framing indication having a predetermined sequential relationship to the successive display of the dial angular positions.

11. The apparatus defined in claim 1 wherein each disc is mounted on the front of the associated dial, and wherein the first means, the second means, the sectored detector, and the third means are all mounted in front of the discs to facilitate addition of said apparatus to a pre-existing meter.

12. The method of reading a meter having a plurality of rotating dials comprising the steps of:

mounting a patterned disc for rotation with each of the dials, each disc having sectors of different radiant energy attenuating properties so that radiant energy directed to the disc is encoded by the sectored pattern;

directing radiant energy to each disc one at a time in succession;

directing the encoded radiant energy from each disc to a single sensor location;

detecting the intensity of the encoded radiant energy received in each of a plurality of sectors of the sensor location;

determining from the intensities of the received encoded radiant energy sectors the angular position of the disc which was the source of received encoded radiant energy.

13. The method defined in claim 12 wherein the meter is connected to an electrical power distribution network and wherein the method further comprises the steps of:

applying, to the power distribution network for distribution via that network, data signals indicative of the angular positions of the discs.

14. The method defined in claim 12 wherein the intensity of the encoded radiant energy received in each sensor sector is detected by sampling the sensor sectors one at a time in succession, each sensor sector being sampled at least once while radiant energy is being directed to each disc.

15. The method defined in claim 14 wherein radiant energy is directed to each disc intermittently, wherein each sensor sector is sampled at least once while the radiant energy is on to produce a light sample and at least once while the radiant energy is off to produce a dark sample, and wherein the method further comprises the step of subtracting each dark sample from the associated light sample to produce net samples on which the disc angular position determinations are based.

16. The method defined in claim 15 wherein multiple alternating light and dark samples of each sensor sector are taken while radiant energy is being intermittently directed to each disc.

17. The method defined in claim 12 further comprising the step of visually displaying symbolic information representative of the angular position of each disc.

18. The method defined in claim 17 wherein the angular positions of the discs are visually displayed one at a time in a recurrent succession, and wherein the method further comprises the step of displaying a framing indication having a predetermined sequential relationship to the successive display of the disc angular positions.

* * * * *

UNITED STATES PATENT AND TRADEMARK OFFICE
CERTIFICATE OF CORRECTION

PATENT NO. : 4,646,084

DATED : February 24, 1987     Page 1 of 4

INVENTOR(S) : David E. Burrowes et al.

It is certified that error appears in the above-identified patent and that said Letters Patent is hereby corrected as shown below:

Cover Page:   References Cited; U.S. Patent Documents; the following references should be added:

| | | | |
|---|---|---|---|
| --3,846,789 | 11/1974 | Germer et al. | 340/870.02 |
| 4,071,711 | 1/1978 | Beaupre et al. | 179/41A |
| 4,075,699 | 2/1978 | Schneider et al. | 364/492 |
| 4,104,486 | 8/1978 | Martin et al. | 179/2AM |
| 4,105,966 | 8/1978 | Lennon | 324/113 |
| 4,135,181 | 1/1979 | Bogacki et al. | 340/310A |
| 4,161,720 | 7/1979 | Bogacki | 340/150 |
| 4,167,786 | 9/1979 | Miller et al. | 364/493 |
| 4,168,531 | 9/1979 | Eichelberger et al. | 364/900 |
| 4,174,517 | 11/1979 | Mandel | 340/310A |
| 4,180,709 | 12/1979 | Cosgrove et al. | 179/2AM |
| 4,199,761 | 4/1980 | Whyte et al. | 340/695 |
| 4,204,194 | 5/1980 | Bogacki | 340/147SY |
| 4,204,195 | 5/1980 | Bogacki | 340/151 |
| 4,208,630 | 6/1980 | Martinez | 375/7 |
| 4,208,653 | 6/1980 | Abe | 340/151 |

UNITED STATES PATENT AND TRADEMARK OFFICE
CERTIFICATE OF CORRECTION

PATENT NO. : 4,646,084

DATED : February 24, 1987

INVENTOR(S) : David E. Burrowes et al.

It is certified that error appears in the above-identified patent and that said Letters Patent is hereby corrected as shown below:

| | | | |
|---|---|---|---|
| 4,213,119 | 7/1980 | Ward et al. | 340/151 |
| 4,213,182 | 7/1980 | Eichelberger et al. | 364/493 |
| 4,218,737 | 8/1980 | Buscher et al. | 364/493 |
| 4,240,030 | 12/1980 | Bateman et al. | 324/110 |
| 4,241,237 | 12/1980 | Paraskevakos et al. | 179/2AM |
| 4,253,151 | 2/1981 | Bouve | 364/483 |
| 4,254,472 | 3/1981 | Juengel et al. | 364/900 |
| 4,281,325 | 7/1981 | Jarva | 340/870.29 |
| 4,283,772 | 8/1981 | Johnston | 364/900 |
| 4,291,375 | 9/1981 | Wolf | 364/483 |
| 4,301,444 | 11/1981 | Bruckert et al. | 340/870.02 |
| 4,302,750 | 11/1981 | Wadhwani et al. | 340/870.02 |
| 4,315,248 | 2/1982 | Ward | 340/825.72 |
| 4,315,251 | 2/1982 | Robinson et al. | 340/310A |
| 4,316,262 | 2/1982 | Mizuta et al. | 364/900 |
| 4,327,362 | 4/1982 | Hoss | 340/870.02 |
| 4,332,980 | 6/1982 | Reynolds et al. | 179/2A |
| 4,335,447 | 6/1982 | Jerrim | 364/900 |
| 4,337,466 | 6/1982 | Spahn | 340/870.09 |
| 4,350,980 | 9/1982 | Ward | 340/870.02 |
| 4,352,164 | 9/1982 | Reed et al. | 364/900 |
| 4,355,361 | 10/1982 | Riggs et al. | 364/464 |
| 4,361,877 | 11/1982 | Dyer et al. | 364/900 |
| 4,368,519 | 1/1983 | Kennedy | 364/483 |
| 4,388,690 | 6/1983 | Lumsden | 364/483 |
| 4,394,540 | 7/1983 | Willis et al. | 179/2AM |
| 4,396,915 | 8/1983 | Farnsworth et al. | 340/870.03 |
| 4,400,783 | 8/1983 | Locke et al. | 364/483 |
| 4,402,059 | 8/1983 | Kennon et al. | 364/900 |
| 4,406,924 | 9/1983 | Dorey | 179/2A |
| 4,415,896 | 11/1983 | Allgood | 340/870.03 |

UNITED STATES PATENT AND TRADEMARK OFFICE
CERTIFICATE OF CORRECTION

PATENT NO. : 4,646,084

DATED : February 24, 1987                    Page 3 of 4

INVENTOR(S) : David E. Burrowes et al.

It is certified that error appears in the above-identified patent and that said Letters Patent is hereby corrected as shown below:

| | | | |
|---|---|---|---|
| 4,421,980 | 12/1983 | Kuhne | 250/231SE |
| 4,429,366 | 1/1984 | Kennon | 364/482 |
| 4,433,387 | 2/1984 | Dyer et al. | 364/900 |
| 4,455,453 | 6/1984 | Parasekvakos et al. | 179/2AM |
| 4,465,970 | 8/1984 | DiMassimo et al. | 324/116 |
| 4,466,074 | 8/1984 | Jindrick et al. | 364/569 |
| 4,467,434 | 8/1984 | Hurley et al. | 364/483 |
| 4,489,220 | 12/1984 | Oliver | 179/2AM |
| 4,489,384 | 12/1984 | Hurley et al. | 364/483 |
| 4,504,831 | 3/1985 | Jahr et al. | 340/870.03-- |

Column 1, line 39:   change "controling" to --controlling--.
          line 51:   after "can" insert --be--.
Column 3, line 22:   change "by" to --be--.
          line 33:   change "hase" to --has--.
          line 45:   delete "a".
Column 4, line 22:   change "signal" to --signals--.
Column 5, line 19:   after "signals" insert --)--.
Column 6, line 25:   delete the entire line.
Column 6, line 26:   delete the entire line.
          line 64:   after "pre amplified" insert --signal is passed by capacitor C24 and post-amplified--.
Column 7, line 10:   change "Borrowes" to --Burrowes--.
          line 22:   change "seven-segmnet" to --seven-segment--.
          line 50:   delete "diode".
Column 8, line 20:   after "compares the" insert -- customer's actual demand to the predetermined--.
          line 57:   change "7805CK" to --7805CKC--.

UNITED STATES PATENT AND TRADEMARK OFFICE
CERTIFICATE OF CORRECTION

PATENT NO.  : 4,646,084

DATED       : February 24, 1987

INVENTOR(S) : David E. Burrowes et al.

It is certified that error appears in the above-identified patent and that said Letters Patent is hereby corrected as shown below:

```
Column  9, line 15-16:  change "initializaiton" to
                        --initialization--.
           line 17:     change "." to --,--.
Column 10, line  4:     change "variale" to --variable--.
           line 34:     change "UPDTE" to --UPDATE--.
Column 13, line 51:     change "reeive" to --receive--.
Column 14, line 38:     change "servie" to --service--.
Column 16, line 32:     change "froma" to --from a--.
```

Signed and Sealed this

Ninth Day of February, 1988

*Attest:*

DONALD J. QUIGG

*Attesting Officer*    *Commissioner of Patents and Trademarks*